United States Patent
Shiokawa et al.

(10) Patent No.: US 10,586,916 B2
(45) Date of Patent: Mar. 10, 2020

(54) SPIN CURRENT MAGNETIZATION REVERSAL ELEMENT, MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/778,115

(22) PCT Filed: Nov. 25, 2016

(86) PCT No.: PCT/JP2016/085001
§ 371 (c)(1),
(2) Date: May 22, 2018

(87) PCT Pub. No.: WO2017/090739
PCT Pub. Date: Jan. 6, 2017

(65) Prior Publication Data
US 2018/0350417 A1    Dec. 6, 2018

(30) Foreign Application Priority Data

Nov. 27, 2015  (JP) .................... 2015-232334
Mar. 16, 2016  (JP) .................... 2016-053072
(Continued)

(51) Int. Cl.
*G11C 11/16*  (2006.01)
*G01R 33/09*  (2006.01)
(Continued)

(52) U.S. Cl.
CPC ............ *H01L 43/06* (2013.01); *G01R 33/098* (2013.01); *G11C 11/161* (2013.01);
(Continued)

(58) Field of Classification Search
CPC .......... G01R 33/09; G11C 11/16; H01L 43/08
See application file for complete search history.

(56) References Cited

U.S. PATENT DOCUMENTS 4,785,241 A   11/1988   Abiko et al.
6,754,100 B1   6/2004   Hayakawa
(Continued)

FOREIGN PATENT DOCUMENTS

JP   2009194070 A   8/2009
JP   2014045196 A   3/2014
(Continued)

OTHER PUBLICATIONS

I.M. Miron et al., "Perpendicular switching of a single ferromagnetic layer induced by in-plane current injection", Nature, 476, pp. 189-194, 2011.
(Continued)

*Primary Examiner* — Kenneth Parker
*Assistant Examiner* — Long H Le
(74) *Attorney, Agent, or Firm* — Oliff PLC

(57) ABSTRACT

A spin current magnetization reversal element includes: a first ferromagnetic metal layer with a changeable magnetization direction, and a spin-orbit torque wiring, wherein a first direction is defined as a direction perpendicular to a surface of the first ferromagnetic metal layer, the wiring extends in a second direction intersecting the first and is bonded to a first surface of the first ferromagnetic metal layer, wherein the wiring includes a pure spin current generator which is bonded to the metal layer, and a low-resistance portion which is connected to both ends of the generator in the second direction and is formed of a material having a smaller electrical resistivity than the generator, and the generator is formed so that an area of a cross-section orthogonal to the first direction continuously and/or step-
(Continued)

wisely increases as it recedes from a bonding surface bonded to the first ferromagnetic metal layer in the first direction.

17 Claims, 9 Drawing Sheets

(30) Foreign Application Priority Data

| Mar. 18, 2016 | (JP) | ................ | 2016-056058 |
|---|---|---|---|
| Oct. 27, 2016 | (JP) | ................ | 2016-210531 |
| Oct. 27, 2016 | (JP) | ................ | 2016-210533 |

(51) Int. Cl.

| *H01L 43/08* | (2006.01) |
|---|---|
| *H03B 15/00* | (2006.01) |
| *H01L 43/06* | (2006.01) |
| *H01L 27/22* | (2006.01) |
| *H01L 43/02* | (2006.01) |
| *H01L 43/10* | (2006.01) |
| *H01L 43/14* | (2006.01) |

(52) U.S. Cl.
CPC ............ *H01L 27/222* (2013.01); *H01L 43/02* (2013.01); *H01L 43/08* (2013.01); *H01L 43/10* (2013.01); *H01L 43/14* (2013.01); *H03B 15/006* (2013.01)

(56) References Cited

U.S. PATENT DOCUMENTS

| 9,218,864 | B1 | 12/2015 | Yi et al. | |
|---|---|---|---|---|
| 9,864,950 | B2 | 1/2018 | Datta et al. | |
| 9,953,692 | B1 | 4/2018 | Mihajlovic et al. | |
| 9,979,401 | B2 | 5/2018 | Pan et al. | |
| 10,211,394 | B1 | 2/2019 | Inokuchi et al. | |
| 10,229,723 | B1 | 3/2019 | Choi et al. | |
| 2002/0160234 | A1 | 10/2002 | Sakawaki et al. | |
| 2008/0311431 | A1 | 12/2008 | Fuji et al. | |
| 2008/0316657 | A1* | 12/2008 | Zhang ................ | B82Y 10/00 360/324.11 |
| 2009/0166773 | A1 | 7/2009 | Ohno et al. | |
| 2009/0201614 | A1 | 8/2009 | Kudo et al. | |
| 2010/0148167 | A1 | 6/2010 | Whig et al. | |
| 2010/0193888 | A1 | 8/2010 | Gu et al. | |
| 2010/0227050 | A1 | 9/2010 | Kurokawa | |
| 2011/0169112 | A1* | 7/2011 | Chen ................ | B82Y 10/00 257/421 |
| 2012/0250189 | A1* | 10/2012 | Degawa ............ | G01R 33/093 360/235.4 |
| 2013/0114334 | A1 | 5/2013 | Yi et al. | |
| 2014/0010004 | A1 | 1/2014 | Suzuki | |
| 2014/0056060 | A1 | 2/2014 | Khvalkovskiy et al. | |
| 2014/0124882 | A1 | 5/2014 | Khalili Amiri et al. | |
| 2014/0269032 | A1 | 9/2014 | Ong et al. | |
| 2015/0036415 | A1 | 2/2015 | Di Pendina et al. | |
| 2015/0041934 | A1* | 2/2015 | Khvalkovskiy ......... | H01L 43/02 257/421 |
| 2015/0200003 | A1 | 7/2015 | Buhrman et al. | |
| 2015/0213867 | A1 | 7/2015 | Wu et al. | |
| 2015/0213869 | A1* | 7/2015 | Wu ................ | G11C 11/1693 365/154 |
| 2015/0236247 | A1 | 8/2015 | Behin-Aein et al. | |
| 2016/0042778 | A1 | 2/2016 | Manipatruni et al. | |
| 2016/0247550 | A1 | 8/2016 | Fukami et al. | |
| 2016/0276006 | A1 | 9/2016 | Ralph et al. | |
| 2016/0300999 | A1 | 10/2016 | Yi et al. | |
| 2016/0380185 | A1 | 12/2016 | Kato et al. | |
| 2017/0125078 | A1 | 5/2017 | Mihajlovic et al. | |
| 2017/0249990 | A1 | 8/2017 | Bauer et al. | |
| 2018/0277746 | A1 | 9/2018 | Abe et al. | |

FOREIGN PATENT DOCUMENTS

| JP | 2014179618 | A | 9/2014 |
|---|---|---|---|
| WO | 2013/025994 | A2 | 2/2013 |
| WO | 2015/102739 | A2 | 7/2015 |
| WO | 2015/137021 | A1 | 9/2015 |

OTHER PUBLICATIONS

T. Kimura et al., "Estimation of spin-diffusion length from the magnitude of spin-current absorption: Multiterminal ferromagnetic/nonferromagnetic hybrid structures", Physical Review B72(1), pp. 014461-1-014461-6, 2005.
S. Takahashi et al., "Spin injection and detection in magnetic nanostructures", Physical Review B67(5), pp. 052409-1-052409-4, 2003.
J. Bass et al., "Spin-diffusion lengths in metals and alloys, and spin-flipping at metal/metal interfaces: an experimentalist's critical review", J. Physics Condensed Matter 19, pp. 1-50, 2007.
Y.K. Kato et al., "Observation of the Spin Hall Effect in Semiconductors", Science, 306, pp. 1910-1913, 2004.
L. Liu et al., "Spin torque switching with the giant spin Hall effect of tantalum", Science, vol. 336, pp. 1-18, and vol. 555, pp. 1-12, 2012.
L. Liu et al., "Current-Induced Switching of Perpendicularly Magnetized Magnetic Layers Using Spin Torque from the Spin Hall Effect", Physical Review Letters, 109, pp. 096602-1-096602-5, 2012.
KS. Lee et al., "Threshold current for switching of a perpendicular magnetic layer induced by spin Hall effect", Applied Physics Letters, 102, pp. 112410-1-112410-5, 2013.
KS. Lee et al., "Thermally activated switching of perpendicular magnet by spin-orbit spin torque", Applied Physics Letters, 104, pp. 072413-1-072413-5, 2014.
G. Yu et al, "Switching of perpendicular magnetization by spin-orbit torques in the absence of external magnetic fields", nature nanotechnology, 9, pp. 548-554, 2014.
S. Fukami et al., "Magnetization switching by spin-orbit torque in an antiferromagnet-ferromagnet bilayer system", nature materials, 15, pp. 535-542, 2016.
S. Fukami et al., "A spin-orbit torque switching scheme with collinear magnetic easy axis and current; configuration", nature nanotechnology, 11, pp. 1-6, 2016.
M. Gradhand et al., "Spin Hall angle versus spin diffusion length: Tailored by impurities", Physical Review B, 81, pp. 245109-1-245109-5, 2010.
Feb. 7, 2017 International Search Report issued in Application No. PCT/JP2016/084968.
Feb. 7, 2017 International Search Report issued in Patent Application No. PCT/JP2016/085001.
Feb. 7, 2017 International Search Report issued in Patent Application No. PCT/JP2016/084976.
Feb. 14, 2017 International Search Report issued in Patent Application No. PCT/JP2016/084979.
Feb. 14, 2017 International Search Report issued in Patent Application No. PCT/JP2016/084974.
Feb. 7, 2017 International Search Report issued in Patent Application No. PCT/JP2016/084995.
U.S. Appl. No. 15/777,884, filed May 21, 2018 in the name of Sasaki et al.
U.S. Appl. No. 15/777,894, filed May 21, 2018 in the name of Sasaki.
U.S. Appl. No. 15/778,159, filed May 22, 2018 in the name of Sasaki.
U.S. Appl. No. 15/778,174, filed May 22, 2018 in the name of Sasaki.
U.S. Appl. No. 15/778,577, filed May 23, 2018 in the name of Shiokawa et al.
Apr. 10, 2019 Office Action issued in U.S. Appl. No. 15/777,894.
Feb. 26, 2019 Office Action issued in U.S. Appl. No. 15/778,577.
Mar. 22, 2019 Office Action issued in U.S. Appl. No. 15/777,884.
Sep. 18, 2019 Office Action issued in U.S. Appl. No. 15/778,159.
Dec. 23, 2019 Office Action issued in U.S. Appl. No. 15/778,174.

\* cited by examiner

FIG. 5
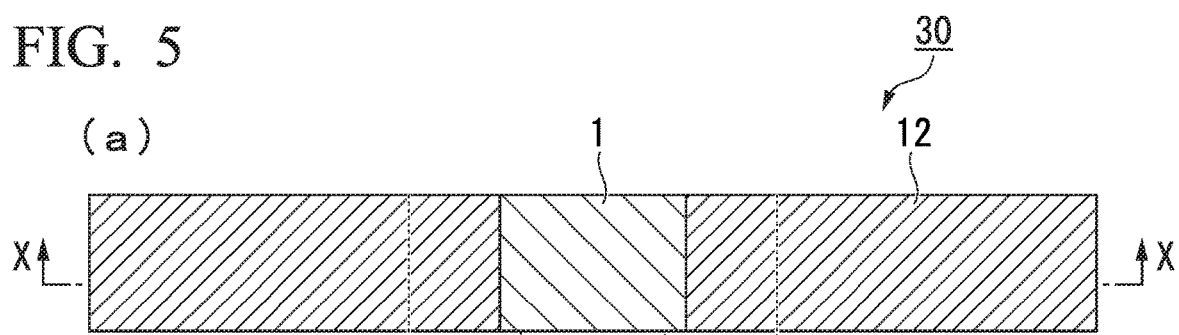
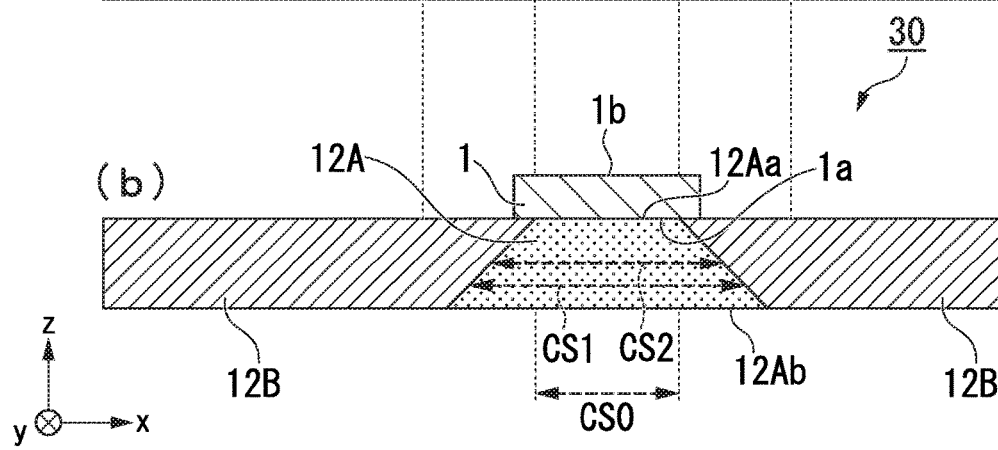
FIG. 6
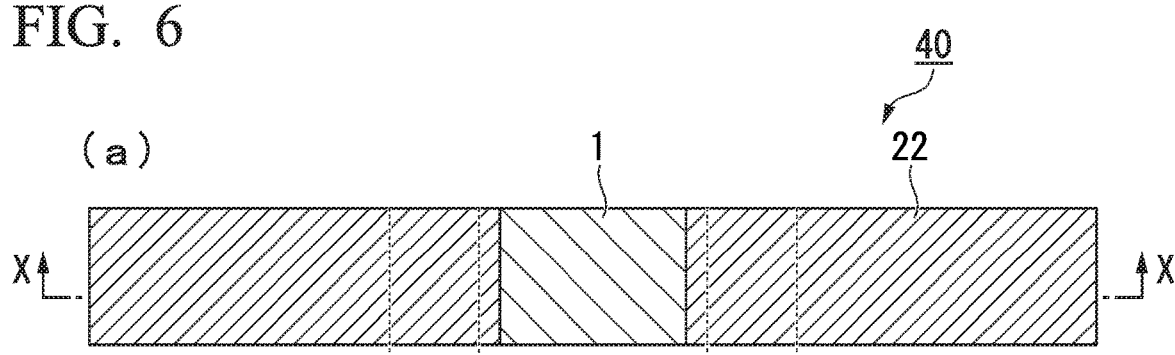
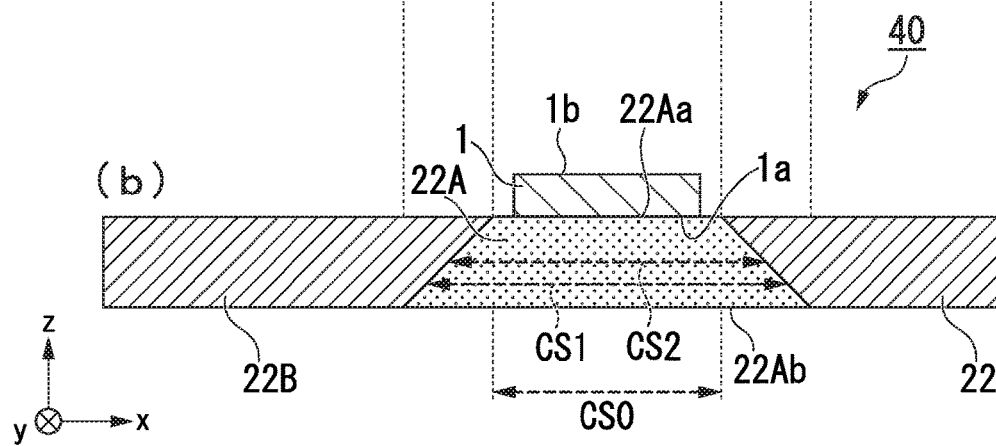

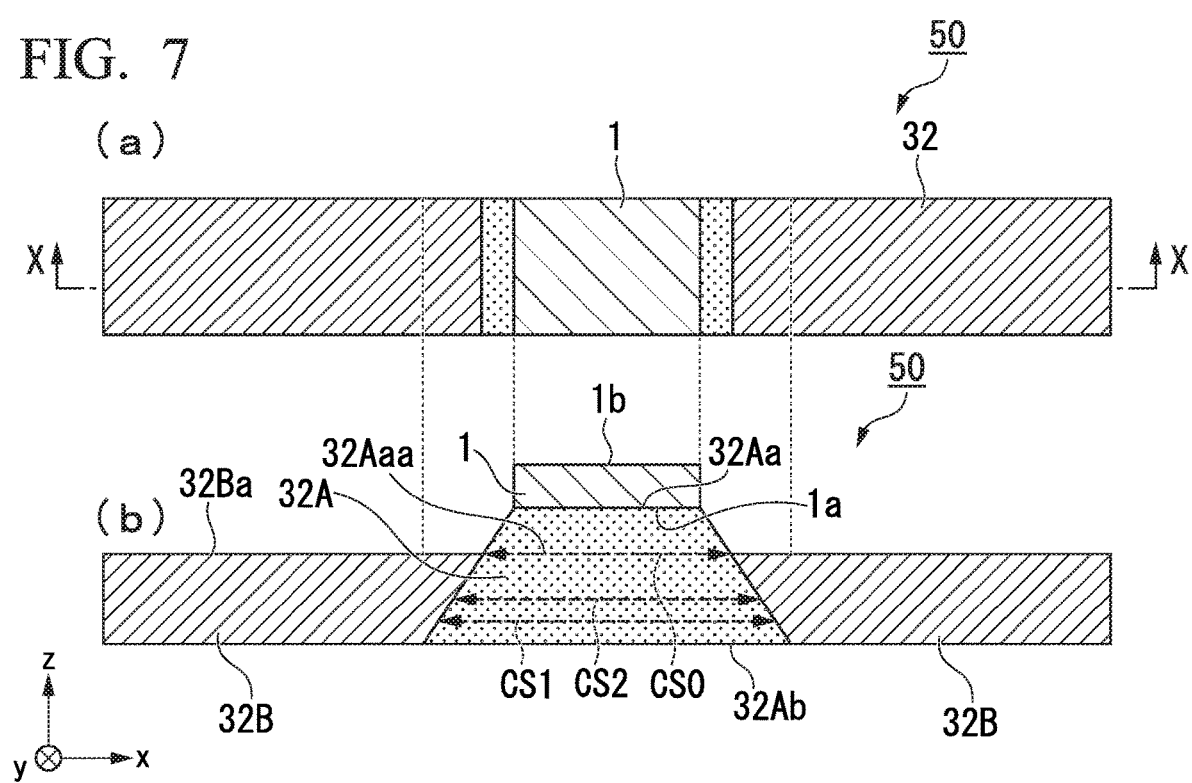
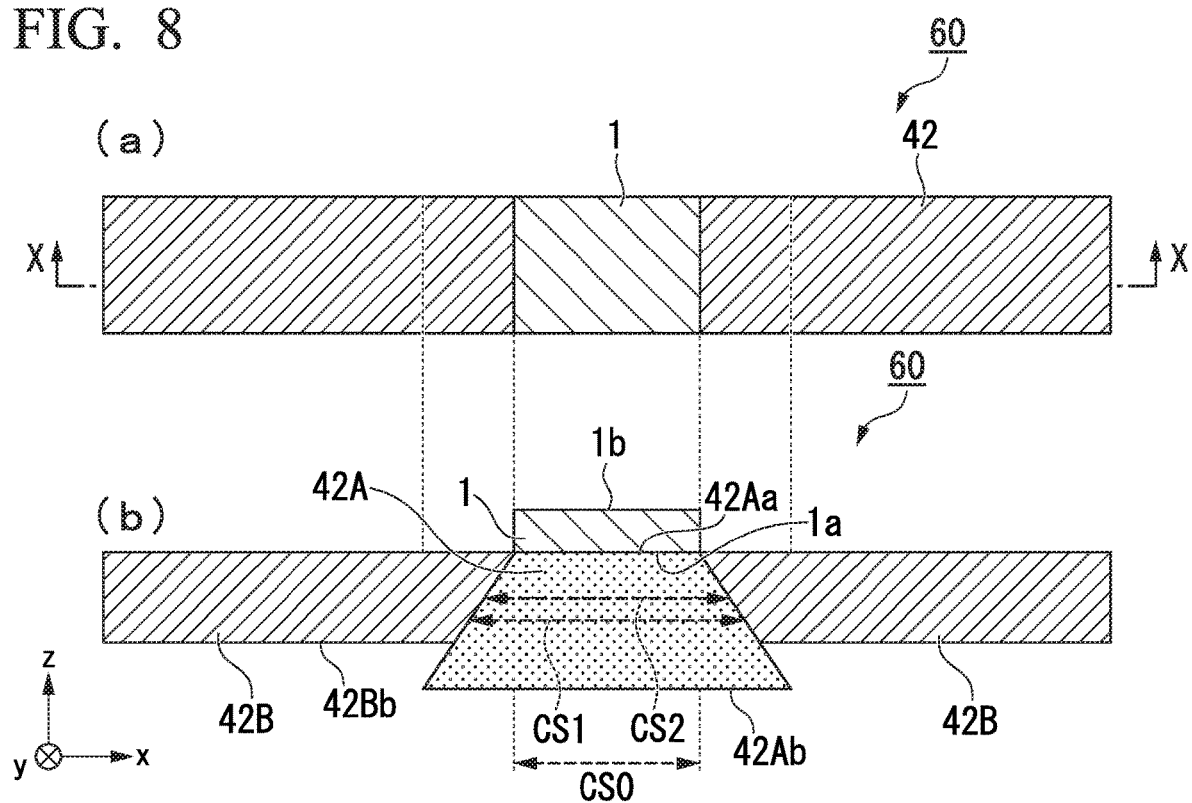

SPIN CURRENT MAGNETIZATION REVERSAL ELEMENT, MAGNETORESISTANCE EFFECT ELEMENT, AND MAGNETIC MEMORY

TECHNICAL FIELD

The present disclosure relates to a spin current magnetization reversal element, a magnetoresistance effect element, and a magnetic memory.

Priority is claimed on Japanese Patent Application No. 2015-232334 filed on Nov. 27, 2015, Japanese Patent Application No. 2016-53072 filed on Mar. 16, 2016, Japanese Patent Application No. 2016-56058 filed on Mar. 18, 2016, Japanese Patent Application No. 2016-210531 filed on Oct. 27, 2016, and Japanese Patent Application No. 2016-210533 filed on Oct. 27, 2016, the content of which is incorporated herein by reference.

BACKGROUND ART

A giant magnetoresistance (GMR) element formed by a multi-layer film including a ferromagnetic layer and a non-magnetic layer, and a tunneling magnetoresistance (TMR) element using an insulating layer (a tunnel barrier layer, a barrier layer) as a non-magnetic layer are known. In general, the TMR element has a higher element resistance than the GMR element, but the TMR element has a higher magnetoresistance (MR) ratio than the GMR element. For that reason, the TMR element has gained attention as an element for magnetic sensors, high-frequency components, magnetic heads, and non-volatile random access memories (MRAM).

As a writing method of an MRAM, a method of performing writing (magnetization reversal) by using a magnetic field caused by a current or a method of performing writing (magnetization reversal) by using a spin transfer torque (STT) generated by a current flowing in a lamination direction of the magnetoresistance element is known.

In the method of using a magnetic field, a problem arises in that the writing cannot be performed by a current flowing in a thin wiring when an element size decreases.

In contrast, in the method of using a spin transfer torque (STT), when one ferromagnetic layer (a fixed layer, a reference layer) spin-polarizes a current, the spin of the current is transferred to magnetization of another ferromagnetic layer (a free layer or a recording layer) and hence the writing (the magnetization reversal) is performed by the torque (STT) generated at that time. In this method, there is an advantage in that a current required for writing can be decreased as the element size decreases.

CITATION LIST

Non-Patent Literature

Non-Patent Document 1: I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).

SUMMARY OF INVENTION

Problems to be Solved by the Invention

Magnetization reversal of a TMR element using STT is efficient from the viewpoint of energy efficiency, but a reversal current density for the magnetization reversal is high. From the viewpoint of a long lifetime (improved durability) of the TMR element, it is desirable for the reversal current density to be low. This point also applies to a GMR element.

In order to cause the magnetization reversal at a time at which information is written to the TMR element, it is necessary to supply a current sufficiently larger than that in a case in which information is read. From the viewpoint of durability of the TMR element, it is desirable for the current applied to the TMR element to be small when information is written to the TMR element.

Thus, in any one of the TMR element and the GMR element among the magnetoresistance elements, it is desirable for a current density of a current flowing in a magnetoresistance effect element to be decreased.

Recently, an applicable method using magnetization reversal using pure spin current generated by a spin-orbit interaction has been proposed (for example, see Non-Patent Document 1). The pure spin current generated by the spin-orbit interaction causes a spin-orbit torque (SOT), and magnetization reversal can be caused by a magnitude of the SOT. The pure spin current is generated by the same number of upward spin electrons and downward spin electrons flowing in opposite directions. Here, since the flow of electric charges is canceled, the current is zero in a direction in which the pure spin current flows. When the magnetization reversal can be caused only by the pure spin current, the current flowing in the magnetoresistance effect element is zero, and hence a lifetime of the magnetoresistance effect element can be improved. Alternatively, when SOT generated by the pure spin current can be used for the magnetization reversal together with STT, a current used by STT can be decreased since SOT, which is generated by the pure spin current, is used. Accordingly, it is considered that the lifetime of the magnetoresistance effect element can be improved. When both STT and SOT are used, it is considered that the lifetime of the magnetoresistance effect element can be improved as the rate of use of SOT increases.

The present disclosure is made in view of the above-described problems and an object of the present disclosure is to provide a spin current magnetization reversal element using magnetization reversal due to a pure spin current, a magnetoresistance effect element using the spin current magnetization reversal element, and a magnetic memory.

Means for Solving the Problems

The present disclosure provides the following means to solve the above-described problems.

(1) A spin current magnetization reversal element according to an aspect of the present disclosure includes: a first ferromagnetic metal layer with a changeable magnetization direction; and a spin-orbit torque wiring, wherein a first direction is defined as a direction perpendicular to a surface of the first ferromagnetic metal layer, the spin-orbit torque wiring extends in a second direction intersecting the first direction, and the spin-orbit torque wiring is bonded to a first surface of the first ferromagnetic metal layer, wherein the spin-orbit torque wiring includes a pure spin current generator which is bonded to the first surface of the first ferromagnetic metal layer and a low-resistance portion which is connected to each of both ends of the pure spin current generator in the second direction and which is formed of a material having a smaller electrical resistivity than the pure spin current generator, and the pure spin current generator has a configuration wherein an area of a cross-section thereof orthogonal to the first direction continuously and/or stepwisely increases as it recedes from a bonding surface bonded to the first ferromagnetic metal layer in the first direction.

(2) In the spin current magnetization reversal element of (1), the low-resistance portion connected to one end of the pure spin current generator and the low-resistance portion connected to the other end of the pure spin current generator may be separated from each other.

(3) In the spin current magnetization reversal element according to (1) or (2), the bonding surface of the pure spin current generator may be included in an area overlapping the first surface of the first ferromagnetic metal layer.

(4) In the spin current magnetization reversal element according to any one of (1) to (3), at least a part of a boundary between the pure spin current generator and the low-resistance portion may be in contact with the first surface of the first ferromagnetic metal layer.

(5) In the spin current magnetization reversal element according to any one of (1) to (4), the low-resistance portion may include a first low-resistance portion and a second low-resistance portion which are separated from each other with the pure spin current generator interposed therebetween.

(6) The spin current magnetization reversal element according to any one of (1) to (5) may further include an insulating layer which is bonded to a surface of the spin-orbit torque wiring which is opposite to a surface bonded to the first ferromagnetic metal layer in the spin-orbit torque wiring.

(7) In the spin current magnetization reversal element according to any one of (1) to (6), a width of the spin-orbit torque wiring may be identical to a width of the first ferromagnetic metal layer.

(8) In the spin current magnetization reversal element according to any one of (1) to (7), the pure spin current generator may include a non-magnetic metal having an atomic number of 39 or more and having d electrons or f electrons and electric resistivity of the pure spin current generator may be two or more times larger than electric resistivity of the low-resistance portion.

(9) A magnetoresistance effect element according to an aspect of the present disclosure includes: the spin current magnetization reversal element according to any one of (1) to (8); a second ferromagnetic metal layer of which a magnetization direction is fixed; and a non-magnetic layer which is interposed between the first ferromagnetic metal layer and the second ferromagnetic metal layer.

(10) A magnetic memory according to an aspect of the present disclosure includes a plurality of the magnetoresistance effect elements of (9).

Advantageous Effects of Invention

According to a spin current magnetization reversal element of the present disclosure, it is possible to provide a spin current magnetization reversal element using magnetization reversal due to a pure spin current.

BRIEF DESCRIPTION OF DRAWINGS

FIG. 5 is a schematic diagram showing another embodiment of the spin current magnetization reversal element of the present disclosure, wherein (a) of FIG. 5 is a plan view and (b) of FIG. 5 is a cross-sectional view.

FIG. 6 is a schematic diagram showing another embodiment of the spin current magnetization reversal element of the present disclosure, wherein (a) of FIG. 6 is a plan view and (b) of FIG. 6 is a cross-sectional view.

FIG. 7 is a schematic diagram showing another embodiment of the spin current magnetization reversal element of the present disclosure, wherein (a) of FIG. 7 is a plan view and (b) of FIG. 7 is a cross-sectional view.

FIG. 8 is a schematic diagram showing another embodiment of the spin current magnetization reversal element of the present disclosure, wherein (a) of FIG. 8 is a plan view and (b) of FIG. 8 is a cross-sectional view.

BEST MODE FOR CARRYING OUT THE INVENTION

Figure 1:
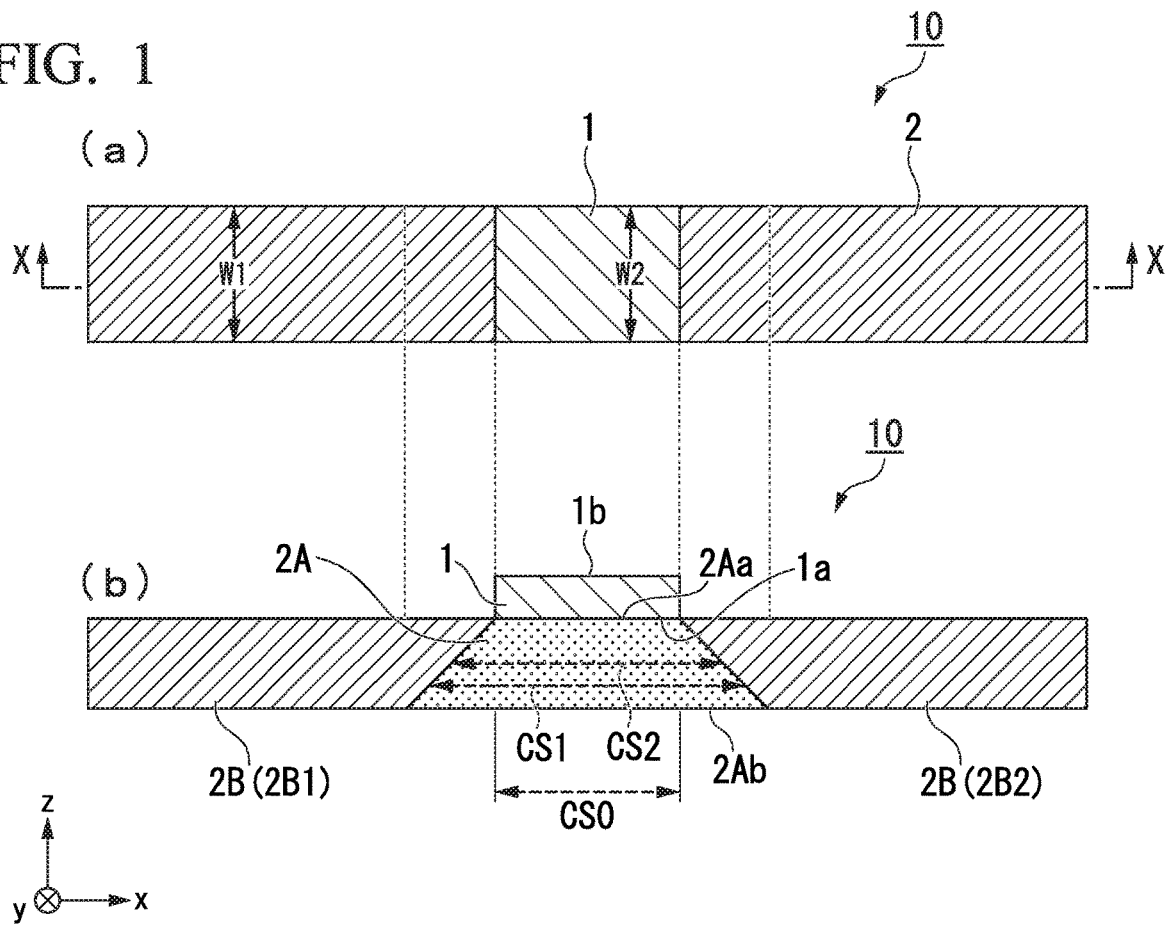
FIG. 1 is a schematic diagram showing an embodiment of a spin current magnetization reversal element of the present disclosure, wherein (a) of FIG. 1 is a plan view and (b) of FIG. 1 is a cross-sectional view.

Hereinafter, the present disclosure will be described in detail with reference to appropriate drawings. In the diagrams used in the following description, a featured part may be enlarged for convenience of description to easily understand the features of the present disclosure, and dimensional ratios of the components may be different from actual ratios. Materials and dimensions in the following description are merely exemplary examples, and the present disclosure is not limited to these examples. Various modifications may be made within a range in which the effect of the present disclosure can be achieved. An element of the present disclosure may include other layers within the range of the effect of the present disclosure.

(Spin Current Magnetization Reversal Element)

A spin current magnetization reversal element of the present disclosure includes: a first ferromagnetic metal layer of which a magnetization direction changes (is changeable) and a spin-orbit torque wiring which extends in a second direction intersecting a first direction which is a direction perpendicular to a surface of the first ferromagnetic metal layer, and which is bonded to a first surface of the first ferromagnetic metal layer, wherein the spin-orbit torque wiring includes a pure spin current generator which is bonded to the first ferromagnetic metal layer, and a low-resistance portion which is formed of a material having a smaller electrical resistivity than the pure spin current generator, and the pure spin current generator is formed so that an area of a cross-section thereof orthogonal to the first direction continuously and/or stepwisely increases as it recedes from a bonding surface bonded to the first ferromagnetic metal layer in the first direction.

Here, a "continuous and/or stepwise increase" includes a case of a "continuous increase," a case of a "stepwise increase," and a case of including a "continuously increasing portion and a stepwise increasing portion." A case of a "continuous increase" corresponds to a case of a gradually increase, and a degree of increase is not particularly limited (see FIG. 1, FIGS. 4 to 8, FIG. 12, and FIG. 13). A case of a "stepwise increase" corresponds to a case in which a predetermined size increases in a plurality of steps (see FIG. 10). In a case of including a "continuously increasing portion and a stepwise increasing portion," an arrangement order of the continuously increasing portion and the stepwise increasing portion is not particularly limited, and the number of the portions is not limited. However, a cross-sectional area at a far position is larger than or equal to a cross-sectional area at a close position in a direction separated from the bonding surface bonded to the first ferromagnetic metal layer (see FIGS. 9 and 11). As an example of a case of including a "continuously increasing portion and a stepwise increasing portion," there is a configuration in which a portion having a uniform cross-sectional area exists at a position separated from the bonding surface and a continuously increasing portion is continued therefrom (see FIG. 9).

The spin-orbit torque wiring layer and the first ferromagnetic metal layer may be bonded to each other "directly" or bonded to each other "through other layers" such as a cap layer, as will be described later. As long as a pure spin current generated in the spin-orbit torque wiring flows to the first ferromagnetic metal layer, a method of bonding (connecting or coupling) the spin-orbit torque wiring and the first ferromagnetic metal layer is not limited.

FIG. 1 shows a schematic diagram of an example of the spin current magnetization reversal element according to the embodiment of the present disclosure. (a) of FIG. 1 is a plan view, and (b) of FIG. 1 is a cross-sectional view taken along line X-X, which is a center line of a spin-orbit torque wiring 2 shown in (a) of FIG. 1 in a width direction thereof.

A spin current magnetization reversal element 10 shown in FIG. 1 includes a first ferromagnetic metal layer 1 which includes a first surface 1a and a second surface 1b opposite the first surface 1a, and of which a magnetization direction changes, and a spin-orbit torque wiring 2 which extends in a second direction (an x direction) intersecting a first direction (a z direction) which is a direction perpendicular to a surface of the first ferromagnetic metal layer 1, and which is bonded to the first surface 1a of the first ferromagnetic metal layer 1. The spin-orbit torque wiring 2 includes a pure spin current generator 2A which is bonded to the first ferromagnetic metal layer 1, and a low-resistance portion 2B which is formed of a material having a smaller electrical resistivity than the pure spin current generator 2A. The pure spin current generator 2A is formed so that an area of a cross-section orthogonal to the first direction continuously increases as it recedes from a bonding surface 2Aa bonded to the first ferromagnetic metal layer 1 in the first direction. That is, the pure spin current generator 2A is formed so that an area (for example, CS1 or CS2) of any cross-section orthogonal to the first direction (the z direction) also is smaller than a cross-sectional area (a bonding area) CS0 of the bonding surface 2Aa bonded to the first ferromagnetic metal layer 1. In other words, the pure spin current generator 2A is formed so that the cross-sectional area (the bonding area) CS0 of the bonding surface 2Aa bonded to the first ferromagnetic metal layer 1 is the smallest among the cross-sectional areas orthogonal to the first direction.

Additionally, in (b) of FIG. 1, lengths of the dotted arrows indicated by reference numerals CS0, CS1, and CS2 schematically show sizes of the cross-sectional areas. The bonding area CS0 of the bonding surface 2Aa bonded to the first ferromagnetic metal layer 1 is shown at a distant position, but this is simply for convenience in the drawing.

Regarding four dotted lines extending from (a) of FIG. 1 to (b) of FIG. 1, two inner dotted lines indicate a length of the bonding surface 2Aa of the pure spin current generator 2A bonded to the first ferromagnetic metal layer 1 in the x direction, and two outer dotted lines indicate a length of a surface 2Ab of the pure spin current generator 2A opposite to the bonding surface 2Aa bonded to the first ferromagnetic metal layer 1 in the x direction.

Hereinafter, a direction which is perpendicular to the surface of the first ferromagnetic metal layer 1 or a direction in which the first ferromagnetic metal layer 1 and the spin-orbit torque wiring 2 are laminated will be set as the z direction (the first direction), a direction (the second direction) which is perpendicular to the z direction and is parallel to the spin-orbit torque wiring 2 will be set as the x direction, and a direction (a third direction) which is orthogonal to the x direction and the z direction will be set as the y direction.

In the following description including FIG. 1, a case of a configuration in which the spin-orbit torque wiring extends in a direction orthogonal to the first direction will be described as an example of a configuration in which the spin-orbit torque wiring extends in a direction intersecting the first direction which is the direction perpendicular to the surface of the first ferromagnetic metal layer.

The spin current magnetization reversal element of the present disclosure, that is, an element which reverses magnetization of a ferromagnetic metal layer due to an SOT effect using a pure spin current, can be used as a main means or an assisting means for magnetization reversal of the ferromagnetic metal layer in a magnetoresistance effect element using STT of a related art and can also be used in a novel magnetoresistance effect element which reverses magnetization of a ferromagnetic metal layer only by SOT using a pure spin current.

<Spin-orbit Torque Wiring>

The spin-orbit torque wiring 2 is formed of a material which generates a pure spin current by a spin hall effect when a current flows thereto. The spin-orbit torque wiring 2 of the present disclosure includes the pure spin current generator 2A which is bonded to the first ferromagnetic metal layer 1 and the low-resistance portion 2B which is connected to each of both ends of the pure spin current generator 2A in the second direction and which is formed of a material having a smaller electrical resistivity than the pure spin current generator 2A.

The spin hall effect is a phenomenon in which a pure spin current is induced in a direction orthogonal to a direction of a current on the basis of a spin-orbit interaction when a current flows in a material.

Figure 2:
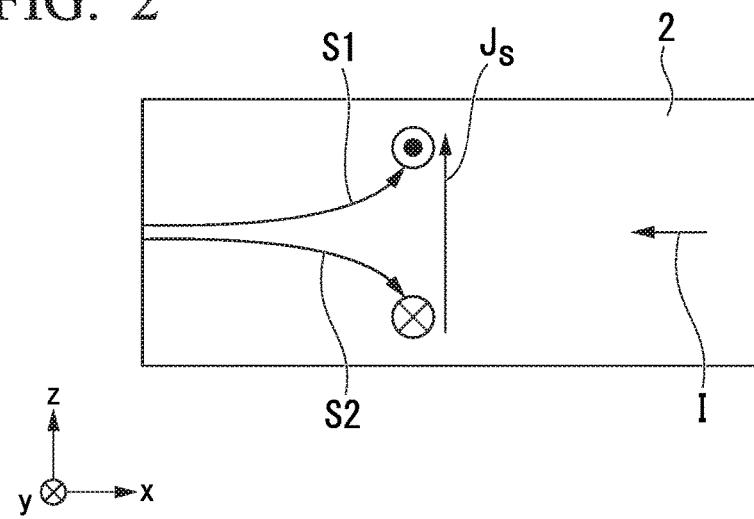
FIG. 2 is a schematic diagram showing a spin hall effect.

FIG. 2 is a schematic diagram showing the spin hall effect. FIG. 2 is a cross-sectional view when the spin-orbit torque wiring 2 shown in FIG. 1 is cut along the x direction. Referring to FIG. 2, a mechanism in which a pure spin current is generated by the spin hall effect will be described.

As shown in FIG. 2, when a current 1 flows in an extension direction of the spin-orbit torque wiring 2, a first spin S1 oriented in a −y direction (the front side of the paper) and a second spin S2 oriented in a +y direction (the rear side of the paper) can be respectively bent in a direction orthogonal to the current. The ordinary hall effect and the spin hall effect are common in that the motion (movement) direction of a charge (electron) that acts (moves) is bent. However, there is a big difference in that the ordinary hall effect has a feature in that a movement direction of charged particles moving in a magnetic field can bent by a Lorentz force, and the spin hall effect has a feature in that the movement direction can be bent only by electron movement (current flows) even though there is no magnetic field.

In a non-magnetic material (a material other than a ferromagnetic material), since the number of electrons of the first spin S1 is the same as the number of electrons of the second spin S2, the number of electrons of the first spin S1 directed upward in the drawing is the same as the number of electrons of the second spin S2 directed downward. For that reason, a current flowing as a net charge flow is zero. The spin current without current is specifically called a pure spin current.

When the current flows in the ferromagnetic material, the first spin S1 and the second spin S2 are bent in opposite directions in the same way. Meanwhile, in the ferromagnetic material, one of the first spin S1 and the second spin S2 is large, and as a result, a net charge flow will occur (a voltage occurs). Thus, as a material of the spin-orbit torque wiring 2, a material only including a ferromagnetic material is not included.

Here, when the flow of electrons of the first spin S1 is indicated by J↑, the flow of electrons of the second spin S2 is indicated by J↓, and the spin current is indicated by is, it is defined as JS=J↑−J↓. In FIG. 2, is corresponding to a pure spin current flows upward in the drawing. Here, $J_S$ indicates the flow of electrons having a polarization ratio of 100%.

In FIG. 1, when a ferromagnetic material is brought into contact with a top surface of the spin-orbit torque wiring 2, the pure spin current flows into the ferromagnetic material and is diffused therein. That is, a spin is injected into the first ferromagnetic metal layer 1.

In the spin current magnetization reversal element of the present disclosure, when the current flows in the spin-orbit torque wiring to generate the pure spin current and the pure spin current is diffused in the first ferromagnetic metal layer in contact with the spin-orbit torque wiring in this way, magnetization reversal of the first ferromagnetic metal layer is caused by a spin-orbit torque (SOT) effect of the pure spin current.

There is a current (hereinafter, referred to as an "SOT reversal current") which flows to the spin-orbit torque wiring in order to use the SOT effect, as the current which flows for the magnetization reversal of the spin current magnetization reversal element of the present disclosure. Since the current itself is an ordinary current causing the flow of charges, Joule heat is generated when the current flows.

Here, a heavy metal, which is a material in which the pure spin current is easily generated, has a higher electrical resistivity than metal used as an ordinary wiring.

For that reason, from the viewpoint of reducing the Joule heat caused by the SOT reversal current, it is desirable for the spin-orbit torque wiring to have a part which has a smaller electrical resistivity than materials capable of generating the pure spin current. From this viewpoint, the spin-orbit torque wiring of the spin current magnetization reversal element of the present disclosure includes a portion (a pure spin current generator) formed of a material generating a pure spin current and a portion (a low-resistance portion) having a smaller electrical resistivity than the pure spin current generator.

The pure spin current generator 2A may be formed of a material capable of generating a pure spin current and may include, for example, a plurality of kinds of material portions.

The pure spin current generator 2A may be formed of a material selected from a group including tungsten, rhenium, osmium, iridium, and an alloy including at least one of those metals. Further, tungsten, rhenium, osmium, and iridium have 5d electrons in their outermost shells and have large orbital angular momentum when the five orbits of d orbit are degenerated. For that reason, the spin-orbit interaction causing the spin hall effect increases, and thus a spin current can be efficiently generated.

A material used as the ordinary wiring can be used as the low-resistance portion 2B. For example, aluminum, silver, copper, gold, and the like can be used. The low-resistance portion 2B may be formed of a material having a smaller electrical resistivity than the pure spin current generator 2A, and may include, for example, a plurality of kinds of material portions.

In addition, the pure spin current may be generated in the low-resistance portion. In this case, the pure spin current generator and the low-resistance portion can be distinguished by descriptions of the materials of the pure spin current generator and the materials of the low-resistance portion described in the specification as the pure spin current generator or the low-resistance portion. Further, a portion other than a main portion generating the pure spin current and having a smaller electrical resistivity than the main portion can be distinguished from the pure spin current generator as the low-resistance portion.

The pure spin current generator 2A may be formed of a material having an electrical resistivity which is at least twice that of the low-resistance portion 2B. When a difference in electrical resistivity is large in this way, a current is intensively applied to the bonding surface between the pure spin current generator 2A and the low-resistance portion 2B, and thus a current density of the bonding surface increases.

The pure spin current generator 2A may include a non-magnetic heavy metal.

Here, the heavy metal is used with the meaning of a metal having a specific gravity higher than or equal to that of yttrium.

In this case, it is desirable for the non-magnetic heavy metal to be a non-magnetic metal having a large atomic number such as to be an atomic number of 39 or more and having d electrons or f electrons in its outermost shell. Such a non-magnetic metal has a large spin-orbit interaction causing the spin hall effect. The pure spin current generator 2A may be formed of only a non-magnetic metal having a large atomic number which is 39 or more and having d electrons or f electrons in its outermost shell.

Generally, when a current flows in a metal, all electrons move in a direction opposite the current regardless of a direction of a spin. However, since a non-magnetic metal having a large atomic number and having d electrons or f electrons in its outermost shell has a large spin-orbit interaction, a direction in which electrons move is dependent on an orientation of an electron spin due to the spin hall effect, and thus the pure spin current is easily generated.

If it is assumed that the low-resistance portion is formed of Cu (1.7 μΩcm), Y, Zr, Nb, Mo, Ru, Pd, Cd, La, Hf, Ta, W, Re, Os, Ir, Pt, Hg, Ce, Pr, Nd, Sm, Eu, Gd, Tb, Dy, Ho, Er, Tin, Yb, and Lu are exemplary examples of a material having an atomic number of 39 or more and having an electrical resistivity two or more times larger than Cu.

When the pure spin current generator 2A includes the non-magnetic heavy metal, a heavy metal capable of generating a pure spin current can be included therein at a predetermined ratio. Furthermore, in this case, it is desirable for the pure spin current generator to be in a concentration range in which the heavy metal capable of generating a pure spin current is sufficiently smaller than the main component of the pure spin current generator or a concentration range in which the heavy metal capable of generating a pure spin current is, for example, 90% or more of a main component. As for the heavy metal in this case, it is preferable that 100% of the heavy metal capable of generating a pure spin current is the non-magnetic metal having an atomic number of 39 or more and having d electrons or f electrons in its outermost shell.

Here, a concentration range in which the heavy metal capable of generating a pure spin current is sufficiently smaller than the main component of the pure spin current generator indicates, for example, a case in which the concentration of the heavy metal is 10% or less in a molar ratio in the pure spin current generator mainly including copper as a main component. When the main component constituting the spin current generator is formed of a material other than the above-described heavy metal, the concentration of the heavy metal included in the pure spin current generator is 50% or less in a molar ratio, and is further desirably 10% or less in the molar ratio. These concentration ranges are ranges in which a spin scattering effect of the electrons can be effectively obtained. When the concentration of the heavy metal is low, the main component is a light metal with a smaller atomic number than a heavy metal. Additionally, in this case, it is assumed that the heavy metal does not form an alloy with a light metal and atoms of the heavy metal are scattered in the light metal in disorder. Since the spin-orbit interaction in the light metal is weak, the pure spin current is not easily generated by the spin hall effect. However, since there is an effect of the spin also being scattered in a boundary face between the light metal and the heavy metal when electrons pass through the heavy metal in the light metal, the pure spin current can be efficiently generated also in a range in which the concentration of the heavy metal is low. When the concentration of the heavy metal exceeds 50%, a rate (generation rate) of the spin hall effect in the heavy metal increases, but since the effect at the boundary face between the light metal and the heavy metal decreases, a total effect decreases. Thus, it is desirable for the concentration of the heavy metal to be a degree in which a sufficient boundary face effect can be expected.

Further, the pure spin current generator 2A may include a magnetic metal. The magnetic metal indicates a ferromagnetic metal or an antiferromagnetic metal. When a small amount of the magnetic metal is included in the non-magnetic metal, the spin-orbit interaction is strengthened, and thus spin current generation efficiency for a current flowing to the pure spin current generator 2A can be improved. The pure spin current generator 2A may include only the antiferromagnetic metal. The antiferromagnetic metal can obtain the same effect as that of a case in which the heavy metal is 100% of the non-magnetic metal having an atomic number of 39 or more and having d electrons or f electrons in its outermost shell. As the antiferromagnetic metal, for example, IrMn or PtMn is desirable, and IrMn which is stable with regards to heat is more desirable.

Since the spin-orbit interaction is generated by an original internal field of the spin-orbit torque wiring material, the pure spin current is also generated in the non-magnetic material. Since the electron spin flowing in the magnetic metal is scattered by the magnetic metal itself when a small amount of the magnetic metal is added to the spin-orbit torque wiring material, spin current generation efficiency is improved. However, when the magnetic metal addition amount is excessively increased, the generated pure spin current is scattered by the added magnetic metal, and as a result, an action in which the spin current decreases is strengthened. Thus, it is desirable for a molar ratio of the added magnetic metal to be sufficiently smaller than a molar ratio of the main component of the pure spin current generator 2A. Basically speaking, the molar ratio of the added magnetic metal is desirably 3% or less.

Further, the pure spin current generator 2A may include a topological insulator. The pure spin current generator 2A may include only the topological insulator. The topological insulator indicates a material in which an inner material is an insulator or a high-resistance body and a spin-polarized metallic state is generated on the surface. Material may have an internal magnetic field such as a spin-orbit interaction. Here, even when there is no external magnetic field, a new topological state develops due to the effect of the spin-orbit interaction. This is a topological insulator, and the pure spin current can be generated with high efficiency by a strong spin-orbit interaction and breaking of reversal symmetry at an edge thereof.

For example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, and the like are desirable as the topological insulator. These topological insulators can generate the spin current with high efficiency.

The spin current magnetization reversal element 10 shown in FIG. 1 can decrease a resistance of an entire circuit through a configuration in which the spin-orbit torque wiring 2 includes the low-resistance portion 2B, and can increase the current density to the largest value at the bonding surface 2Aa of the pure spin current generator 2A through a configuration in which the bonding area CS0 of the bonding surface 2Aa bonded to the first ferromagnetic metal layer 1 in the pure spin current generator 2A constituting the spin-orbit torque wiring 2 is set to be the smallest. Accordingly, a density of the pure spin current diffused in the first ferromagnetic metal layer 1 increases, and thus efficiency of spin injection into the first ferromagnetic metal layer 1 is improved.

In the spin current magnetization reversal element 10 shown in FIG. 1, the surface 2Ab opposite to the surface 2Aa bonded to the first surface 1a of the first ferromagnetic metal layer 1 in the pure spin current generator 2A is not covered by the low-resistance portion.

More specifically, the low-resistance portion 2B connected to one end of the pure spin current generator 2A and the low-resistance portion 2B connected to the other end of the pure spin current generator 2A are separated.

That is, the low-resistance portion 2B connected to one end and the low-resistance portion 2B connected to the other end are not connected by a low-resistance material other than the pure spin current generator 2A.

In this case, a current flowing in the spin-orbit torque wiring does not leak from the lower portion of the pure spin current generator 2A.

Further, the bonding surface 2Aa of the pure spin current generator 2A is included in an area overlapping the first surface 1a of the first ferromagnetic metal layer 1.

Hereinafter, a shape and an effect of the pure spin current generator of the spin-orbit torque wiring of the present disclosure will be described.

Figure 3:
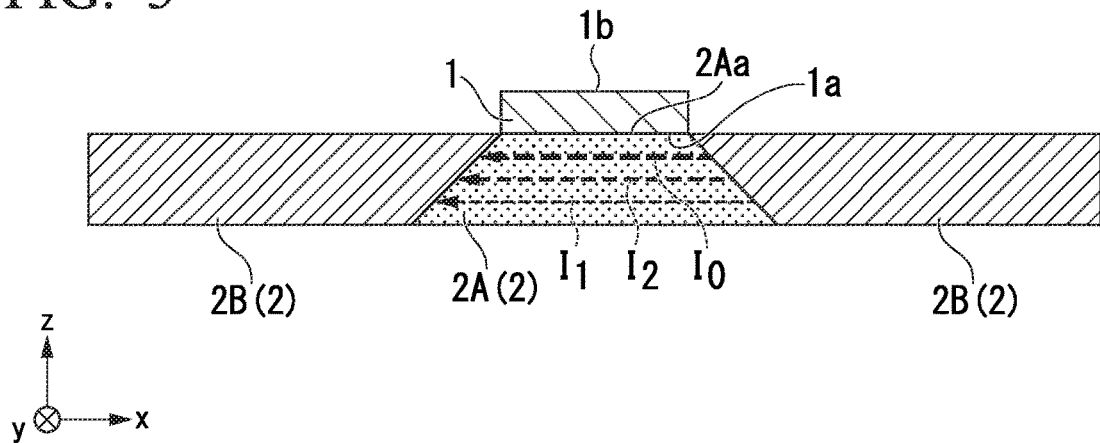
FIG. 3 is a conceptual diagram showing a principle of the present disclosure.

Referring to FIG. 3, a principle of the present disclosure will be described first.

FIG. 3 is a cross-sectional view which is the same as the cross-sectional view of the spin current magnetization reversal element shown in (b) of FIG. 1.

Dotted arrows $I_0$, $I_1$, and $I_2$ respectively schematically show the current density at a position of the bonding area CS0 (that is, the bonding surface 2Aa), a position of the cross-sectional area CS1, and a position of the cross-sectional area CS2. The thickness of the dotted arrow schematically shows a difference in magnitude of a current density, and the current density increases as the thickness increases.

In the spin-orbit torque wiring 2, since the low-resistance portion 2B is formed of one kind of material and has a uniform cross-sectional shape, the current density is uniform. Meanwhile, a material is the same in the pure spin current generator 2A, but the cross-sectional area increases as it recedes from the first surface 1a of the first ferromagnetic metal layer 1. The pure spin current generator 2A is formed of a material having a higher electrical resistivity than the low-resistance portion 2B. Thus, a current is more concentrated on a surface having a smaller cross-sectional area in the pure spin current generator.

The spin-orbit torque wiring 2 shown in FIG. 1 is formed so that an area of a cross-section thereof orthogonal to the first direction (the z direction) in the pure spin current generator 2A continuously increases as it recedes from the bonding surface 2Aa bonded to the first ferromagnetic metal layer 1 in the first direction (more specifically, the bonding area (corresponding to the "cross-sectional area of the bonding surface") bonding to the first ferromagnetic metal layer 1 in the bonding surface 2Aa is smaller than an area of any cross-section of the wiring which is separated from the bonding surface bonding to the first ferromagnetic metal layer 1), thereby allowing a current to be concentrated on the bonding surface 2Aa bonding to the first ferromagnetic metal layer 1 in the pure spin current generator 2A. As a result, since the density of the pure spin current diffused in the first ferromagnetic metal layer 1 bonded to the bonding surface 2Aa is increased, efficiency of spin injection into the first ferromagnetic metal layer 1 can be improved.

A shape in which the bonding surface bonding to the first ferromagnetic metal layer is included in an area of a cross-section separated from the bonding surface when viewed from above in the z direction (a case is also includes in which the bonding surface and the cross-section completely overlap each other) is desirable as a shape of the pure spin current generator.

In the embodiment shown in FIG. 1, the pure spin current generator 2A has a pyramid shape. That is, the pure spin current generator 2A has a three-dimensional shape obtained by removing a pyramid shrunk in a similar manner from a pyramid sharing its apex. Here, assuming that a frustum made from a cone is a truncated cone frustum, a frustum made from an elliptical cone is an elliptical cone frustum, a frustum made from a pyramid is a pyramid frustum, and a frustum made from an n-pyramid is an n-pyramid frustum, an example shown in FIG. 1 corresponds to a rectangular frustum having a rectangular cross-section, but may have other frustum shapes.

In the embodiment shown in FIG. 1, the pure spin current generator 2A is formed so that a boundary face thereof with respect to the low-resistance portion 2B is linear in a cross-section parallel to an xz plane, but the boundary face may be formed in a curved shape. The curved shape may include a curved shape protruding toward the low-resistance portion and a curved shape protruding toward the pure spin current generator, and the curved shape may be formed in response to a manufacturing process.

Further, in the embodiment shown in FIG. 1, the bonding surface 2Aa bonded to the first ferromagnetic metal layer 1 in the pure spin current generator 2A matches the bonding surface (the first surface) 1a bonded to the pure spin current generator 2A in the first ferromagnetic metal layer 1. In other words, the bonding surface 2Aa and the bonding surface 1a completely overlap when viewed from above in the z direction. In this case, the pure spin current generated by the pure spin current generator 2A can be effectively diffused in the first ferromagnetic metal layer 1.

Further, in the embodiment shown in FIG. 1, the low-resistance portion 2B includes a first low-resistance portion 2B1 and a second low-resistance portion 2B2 which are separated from each other with the pure spin current generator 2A interposed therebetween. For this reason, since a current flowing in the spin-orbit torque wiring 2 essentially passes through the pure spin current generator 2A, the current (SOT reversal current) flowing in the spin-orbit torque wiring 2 can be entirely used to generate the pure spin current.

Also, in other embodiments, which will described below, the low-resistance portion includes the first low-resistance portion and the second low-resistance portion which are separated from each other with the pure spin current generator interposed therebetween, unless otherwise specified.

Further, in the embodiment shown in FIG. 1, a width W1 in a direction (the y direction) orthogonal to a longitudinal direction of the spin-orbit torque wiring 2 is equal to a width W2 in the same direction of the first ferromagnetic metal layer 1. In this case, it is possible to simultaneously process both ends of the first ferromagnetic metal layer 1 and the spin-orbit torque wiring 2 in the y direction.

Figure 4:
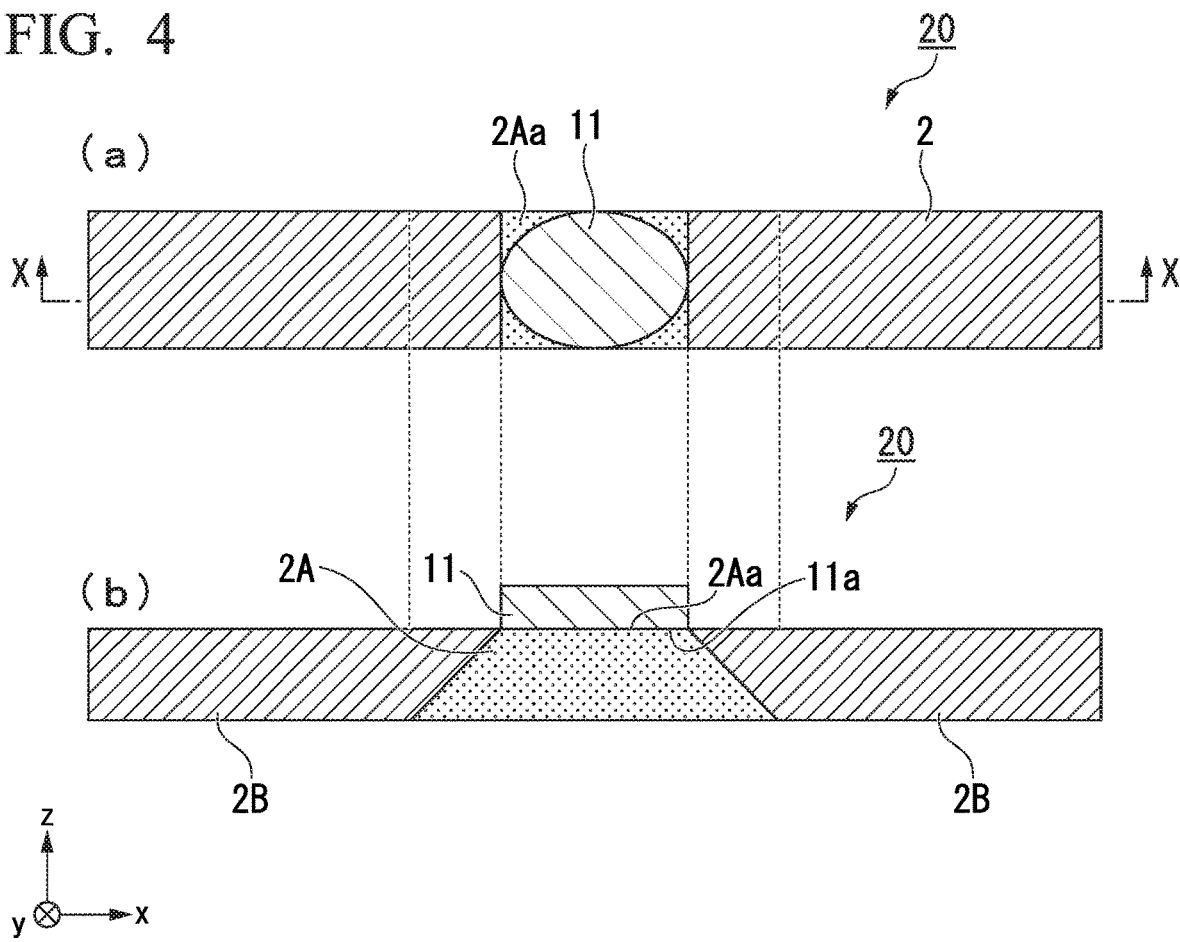
FIG. 4 is a schematic diagram showing another embodiment of the spin current magnetization reversal element of the present disclosure, wherein (a) of FIG. 4 is a plan view and (b) of FIG. 4 is a cross-sectional view.

In the embodiment shown in FIG. 1, the first ferromagnetic metal layer 1 has a square shape (more accurately, a rectangular shape) when viewed from above in the z direction, but may be formed in an elliptical shape as shown in FIG. 4 or other shapes. This point also applies to the other embodiments which will described below.

However, in a spin current magnetization reversal element portion 20 shown in FIG. 4, the bonding surface 2Aa bonded to the first ferromagnetic metal layer 11 in the pure spin current generator 2A does not match the bonding surface 11a bonded to the pure spin current generator 2A in the first ferromagnetic metal layer 11, and the bonding surface 2Aa is larger than the bonding surface 11a when viewed from above in the z direction. In this case, a pure spin current generated by the pure spin current generator 2A cannot be sufficiently diffused in the first ferromagnetic metal layer 1 when compared to the spin current magnetization reversal element 10 shown in FIG. 1.

Further, a shape of the pure spin current generator may be a shape in which a bonding surface thereof matches a first surface of the first ferromagnetic metal layer in accordance with a shape of the first ferromagnetic metal layer. That is, for example, in (a) of FIG. 4, the bonding surface 2Aa bonded to the first ferromagnetic metal layer 11 in the pure spin current generator 2A may match the bonding surface 11a bonded to the pure spin current generator 2A in the first ferromagnetic metal layer 11, and the bonding surface 2Aa may overlap the bonding surface Ila when viewed from above in the z direction.

FIG. 5 shows a schematic diagram of an example of a spin current magnetization reversal element according to another embodiment of the present disclosure. (a) of FIG. 5 is a plan view, and (b) of FIG. 5 is a cross-sectional view taken along line X-X, which is a center line of a spin-orbit torque wiring 12 shown in (a) of FIG. 5 in a width direction thereof. Since the same reference numerals will be used for the same components as those of FIG. 1, descriptions thereof will be omitted.

A spin current magnetization reversal element 30 shown in FIG. 5 is also formed so that an area of a cross-section of a pure spin current generator 12A of the spin-orbit torque wiring 12 orthogonal to the first direction (the z direction) continuously increases as it recedes from a bonding surface 12Aa bonded to the first ferromagnetic metal layer 1 in the first direction (the z direction). That is, the pure spin current generator 12A is formed so that an area (for example, CS1 or CS2) of any cross-section orthogonal to the first direction (the z direction) is larger than the cross-sectional area (the bonding area) CS0 of the bonding surface 12Aa bonded to the first ferromagnetic metal layer 1. In other words, the pure spin current generator 12A is formed so that the cross-sectional area (the bonding area) CS0 of the bonding surface 12Aa bonded to the first ferromagnetic metal layer 1 becomes the smallest in areas of cross-sections orthogonal to the first direction (the z direction). Thus, a current density at the bonding surface 12Aa bonding to the first ferromagnetic metal layer 1 in the pure spin current generator 12A is the highest. As a result, it is possible to improve spin injection efficiency of the first ferromagnetic metal layer 1 by increasing the density of a pure spin current diffused in the first ferromagnetic metal layer 1.

Further, in the spin current magnetization reversal element 30 shown in FIG. 5, at least a part of the boundary between the pure spin current generator 12A and a low-resistance portion 12B is in contact with a first surface 1a of the first ferromagnetic metal layer 1.

In the pure spin current generator 12A, since the current is mostly concentrated on a boundary portion with respect to the low-resistance portion 12B and in the vicinity of the bonding surface 12Aa, the pure spin current is easily generated. Thus, the pure spin current can efficiently flow to the first ferromagnetic metal layer 1. Since the pure spin current is diffused and attenuated, the pure spin current generated in the vicinity of the first ferromagnetic metal layer 1 mainly contributes to magnetization reversal of the first ferromagnetic metal layer 1. Since the current is concentrated on the pure spin current generator 12A in the vicinity of the first ferromagnetic metal layer 1, the pure spin current can efficiently flow to the first ferromagnetic metal layer 1.

Further, the pure spin current generated by the pure spin current generator 12A is diffused in the x direction and a y direction, but in the spin current magnetization reversal element 30 shown in FIG. 5, the pure spin current generator 12A is formed so that the bonding surface 12Aa bonding to the first ferromagnetic metal layer 1 is narrower than the first surface 1a of the first ferromagnetic metal layer 1. For this reason, for example, even when the pure spin current generated near the low-resistance portion 12B in the vicinity of the bonding surface 12Aa bonding to the first ferromagnetic metal layer 1 is first diffused somewhat in the x direction, the pure spin current diffused in the first ferromagnetic metal layer 1 can be used for magnetization reversal.

Further, in the spin current magnetization reversal element 30 shown in FIG. 5, the bonding surface 12Aa bonding to the first ferromagnetic metal layer 1 in the pure spin current generator 12A is included in the range of the first surface 1a of the first ferromagnetic metal layer 1 when viewed from above in the first direction (the z direction), and an area of a second surface 12Ab opposite the bonding surface 12Aa bonding to the first ferromagnetic metal layer 1 in the pure spin current generator 12A is also small in comparison to the spin current magnetization reversal element 10 shown in FIG. 1. For this reason, since the low-resistance portion of the spin current magnetization reversal element 30 shown in FIG. 5 is increased in comparison to the spin current magnetization reversal element 10 shown in FIG. 1, there is an effect of resistance of the entire element being decreased.

FIG. 6 shows a schematic diagram of an example of a spin current magnetization reversal element according to another embodiment of the present disclosure. (a) of FIG. 6 is a plan view, and (b) of FIG. 6 is a cross-sectional view taken along line X-X, which is a center line of a spin-orbit torque wiring 22 shown in (a) of FIG. 6 in a width direction thereof. Since the same reference numerals will be used for the same components as those of FIG. 1, descriptions thereof will be omitted.

A spin current magnetization reversal element 40 shown in FIG. 6 is also formed so that a cross-sectional area of a cross-section of a pure spin current generator 22A orthogonal to the first direction (the z direction) continuously increases as it recedes from a bonding surface 22Aa bonded to the first ferromagnetic metal layer 1 in the first direction (the z direction). That is, the pure spin current generator 22A is formed so that the cross-sectional area (for example, CS1 or CS2) of any cross-section orthogonal to the first direction (the z direction) is smaller larger than the cross-sectional area (the bonding area) CS0 of the bonding surface 22Aa bonded to the first ferromagnetic metal layer 1. In other words, the pure spin current generator 22A is formed so that the cross-sectional area (the bonding area) CS0 of the bonding surface 22Aa bonded to the first ferromagnetic metal layer 1 becomes the smallest in cross-sectional areas of cross-sections orthogonal to the first direction (the z direction). Thus, the current density at the bonding surface 22Aa bonding to the first ferromagnetic metal layer 1 in the pure spin current generator 22A becomes the highest. As a result, it is possible to improve efficiency of spin injection into the first ferromagnetic metal layer 1 by increasing the density of a pure spin current diffused in the first ferromagnetic metal layer 1.

Further, in the spin current magnetization reversal element 40 shown in FIG. 6, since the bonding surface 22Aa bonding to the first ferromagnetic metal layer 1 in the pure spin current generator 22A of the spin-orbit torque wiring 22 is larger than an area of the first surface 1a of the first ferromagnetic metal layer 1 when viewed from above in the first direction (the z direction), a rate of which the pure spin current generated by the pure spin current generator 22A cannot be diffused in the first ferromagnetic metal layer 1 is high in comparison to the spin current magnetization reversal element 10 shown in FIG. 1 or the spin current magnetization reversal element 30 shown in FIG. 5.

Further, in the spin current magnetization reversal element 40 shown in FIG. 6, an area of a second surface 22Ab opposite to the bonding surface 22Aa bonding to the first ferromagnetic metal layer 1 in the pure spin current generator 22A is also large in comparison to the spin current magnetization reversal element 10 shown in FIG. 1 or the spin current magnetization reversal element 30 shown in FIG. 5. For this reason, in the spin current magnetization reversal element 40 shown in FIG. 6, since the pure spin current generator is large in comparison to the spin current magnetization reversal element 10 shown in FIG. 1 or the spin current magnetization reversal element 30 shown in FIG. 5, the resistance of the entire element increases.

FIG. 7 shows a schematic diagram of an example of a spin current magnetization reversal element according to another embodiment of the present disclosure. (a) of FIG. 7 is a plan view, and (b) of FIG. 7 is a cross-sectional view taken along line X-X, which is a center line of a spin-orbit torque wiring 32 shown in (a) of FIG. 7 in a width direction thereof. Since the same reference numerals will be used for the same components as those of FIG. 1, descriptions thereof will be omitted.

A spin current magnetization reversal element 50 shown in FIG. 7 is also formed so that an area of a cross-section of a pure spin current generator 32A of the spin-orbit torque wiring 32 orthogonal to the first direction (the z direction) continuously increases as it recedes from a bonding surface 32Aa bonded to the first ferromagnetic metal layer 1 in the first direction (the z direction). That is, the pure spin current generator 32A is formed so that the cross-sectional area (for example, CS1 or CS2) of any cross-section orthogonal to the first direction (the z direction) is smaller larger than the cross-sectional area (the bonding area) CS0 of a cross-section 32Aaa taken along a plane 32Ba on the side of the first ferromagnetic metal layer 1 in the low-resistance portion 32B. In this case, the pure spin current generator 32A is formed so that an area of a cross-section orthogonal to the first direction (the z direction) continuously increases as it recedes from the bonding surface 32Aa bonded to the first ferromagnetic metal layer 1 in the first direction (the z direction), but it should be noted that a cross-section having the smallest cross-sectional area in a portion in which an SOT reversal current flows in the pure spin current generator 32A is the cross-section 32Aaa taken along the plane 32Ba on the side of the first ferromagnetic metal layer 1 in the low-resistance portion 32B and is not the bonding surface 32Aa bonded to the first ferromagnetic metal layer 1. Thus, the cross-section 32Aaa taken along the plane 32Ba on the side of the first ferromagnetic metal layer 1 in the low-resistance portion 32B is closest to the bonding surface 32Aa which is bonded to the first ferromagnetic metal layer 1, and is a portion in which the SOT reversal current flows in the pure spin current generator 32A, and the current density at the cross-section 32Aaa is highest. As a result, it is possible to improve the efficiency of spin injection into the first ferromagnetic metal layer 1 by increasing a density of a pure spin current diffused in the first ferromagnetic metal layer 1.

Further, in the spin current magnetization reversal element 50 shown in FIG. 7, it is desirable for a distance between the bonding surface 32Aa bonded to the first ferromagnetic metal layer 1 and the cross-section 32Aaa taken along the plane 32Ba on the side of the first ferromagnetic metal layer 1 in the low-resistance portion 32B to be smaller than a spin diffusion length in order to diffuse a pure spin current generated by the pure spin current generator 32A in the first ferromagnetic metal layer 1.

Further, in the spin current magnetization reversal element 50 shown in FIG. 7, since a volume of a portion in which the SOT reversal current flows in the pure spin current generator 32A is large, the pure spin current generator is large in comparison to the spin current magnetization reversal element 10 shown in FIG. 1 and the spin current magnetization reversal element 30 shown in FIG. 5, and thus a resistance of the entire element increases.

FIG. 8 shows a schematic diagram of an example of a spin current magnetization reversal element according to another embodiment of the present disclosure. (a) of FIG. 8 is a plan view, and (b) of FIG. 8 is a cross-sectional view taken along line X-X, which is a center line of a spin-orbit torque wiring 42 shown in (a) of FIG. 8 in a width direction thereof. Since the same reference numerals will be used for the same components as those of FIG. 1, descriptions thereof will be omitted.

A spin current magnetization reversal element 60 shown in FIG. 8 is also formed so that an area of a cross-section of the pure spin current generator 42A of the spin-orbit torque wiring 42 orthogonal to the first direction (the z direction) continuously increases as it recedes from a bonding surface 42Aa bonded to the first ferromagnetic metal layer 1 in the first direction (the z direction). That is, the pure spin current generator 42A is formed so that an area (for example, CS1 or CS2) of any cross-section orthogonal to the first direction (the z direction) is larger than the cross-sectional area (the bonding area) CS0 of the bonding surface 42Aa bonded to the first ferromagnetic metal layer 1. In other words, the pure spin current generator 42A is formed so that the cross-sectional area (the bonding area) CS0 of the bonding surface 42Aa bonded to the first ferromagnetic metal layer 1 becomes the smallest in areas of cross-sections orthogonal to the first direction (the z direction). Thus, the current density at the bonding surface 42Aa with respect to the first ferromagnetic metal layer 1 in the pure spin current generator 42A becomes the highest. As a result, it is possible to improve efficiency of spin injection into the first ferromagnetic metal layer 1 by increasing the density of a pure spin current diffused in the first ferromagnetic metal layer 1.

Further, also in the spin current magnetization reversal element 60 shown in FIG. 8, a second surface 42Ab opposite to the bonding surface 42Aa bonding to the first ferromagnetic metal layer 1 in the pure spin current generator 42A protrudes to be separated from the first ferromagnetic metal layer 1 in relation to a cross-section, which is taken along a plane 42Ba on a side of the first ferromagnetic metal layer 1, in the low-resistance portion 42B.

The spin current magnetization reversal element 60 shown in FIG. 8 has a common point with the spin current magnetization reversal element 50 shown in FIG. 7 in that a portion at which an SOT reversal current does not flow is provided in a material constituting the pure spin current generator, but since the SOT reversal current flows in the bonding surface 42Aa bonded to the first ferromagnetic metal layer 1 in the pure spin current generator 42A, there is an advantage in that the pure spin current generated by the pure spin current generator 42A is directly diffused in the first ferromagnetic metal layer 1.

Figure 9:
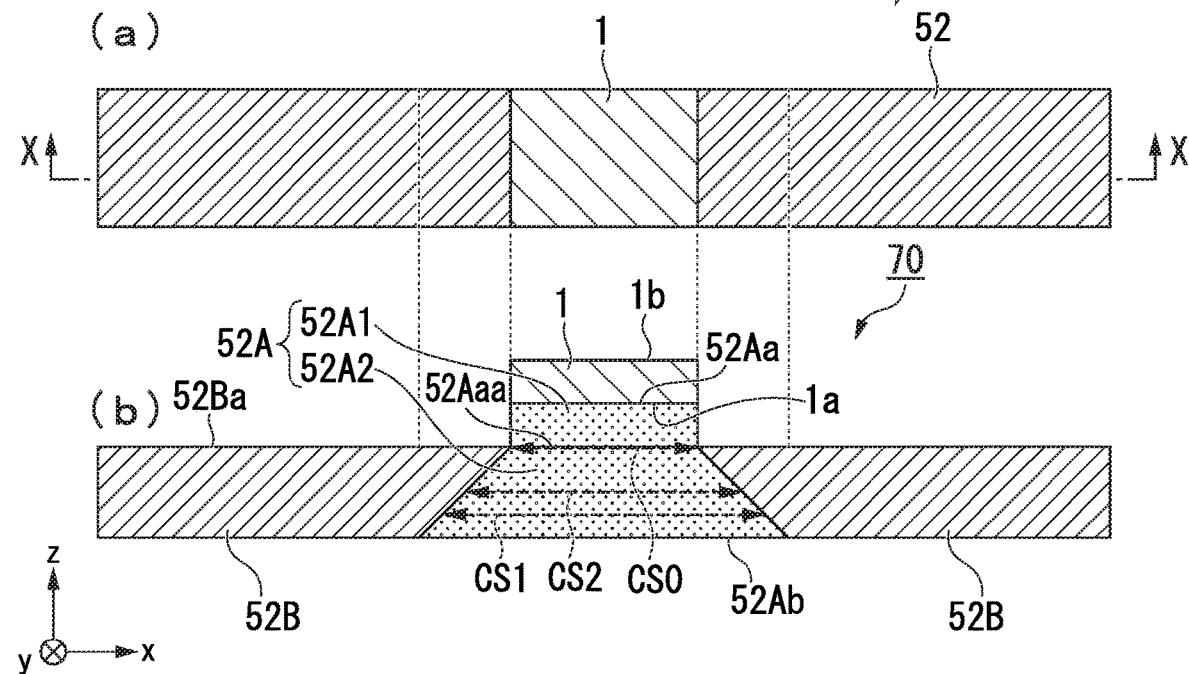
FIG. 9 is a schematic diagram showing another embodiment of the spin current magnetization reversal element of the present disclosure, wherein (a) of FIG. 9 is a plan view and (b) of FIG. 9 is a cross-sectional view.

FIG. 9 shows a schematic diagram of an example of a spin current magnetization reversal element according to another embodiment of the present disclosure. (a) of FIG. 9 is a plan view, and (b) of FIG. 9 is a cross-sectional view taken along line X-X, which is a center line of a spin-orbit torque wiring 52 show in (a) of FIG. 9 in a width direction thereof. Since the same reference numerals will be used for the same components as those of FIG. 1, descriptions thereof will be omitted.

A spin current magnetization reversal element 70 shown in FIG. 9 corresponds to a case in which an area of a cross-section orthogonal to the first direction (the z direction) of a pure spin current generator 52A of the spin-orbit torque wiring 52 includes a "continuously increasing portion" and a "stepwise increasing portion," that is, a case of including a "continuously increasing portion" and a "uniform portion," as it recedes from the bonding surface 52Aa bonded to the first ferromagnetic metal layer 1 in the first direction (the z direction). The pure spin current generator 52A is formed so that its cross-sectional area sequentially includes a uniform portion 52A1 having a uniform cross-sectional area and a continuously increasing portion 52A2 as it recedes from the bonding surface 52Aa bonded to the first ferromagnetic metal layer 1 in the first direction (the z direction). That is, the pure spin current generator 52A is formed so that the cross-sectional area (for example, CS1 or CS2) of any cross-section orthogonal to the first direction (the z direction) is also larger than the cross-sectional area (the bonding area) CS0 of a cross-section 52Aaa taken along a plane 52Ba on a side of the first ferromagnetic metal layer 1 in the low-resistance portion 52B. In this case, it should be noted that the cross-sectional area of the cross-section 52Aaa having the smallest cross-sectional area in a portion at which an SOT reversal current flows in the pure spin current generator 52A is the same as the cross-sectional area (the bonding area) of the bonding surface 52Aa bonded to the first ferromagnetic metal layer 1. In the pure spin current generator 52A, a current density of the cross-section 52Aaa is the highest. As a result, it is possible to improve efficiency of spin injection into the first ferromagnetic metal layer 1 by increasing a density of a pure spin current diffused in the first ferromagnetic metal layer 1.

However, also in the spin current magnetization reversal element 70 shown in FIG. 9, it is desirable for a thickness of the portion 52A1 having a uniform cross-sectional area in the z direction to be smaller than a spin diffusion length in order to diffuse a pure spin current generated by a pure spin current generator 52A2 in the first ferromagnetic metal layer 1 like the spin current magnetization reversal element 50 shown in FIG. 7.

Figure 10:
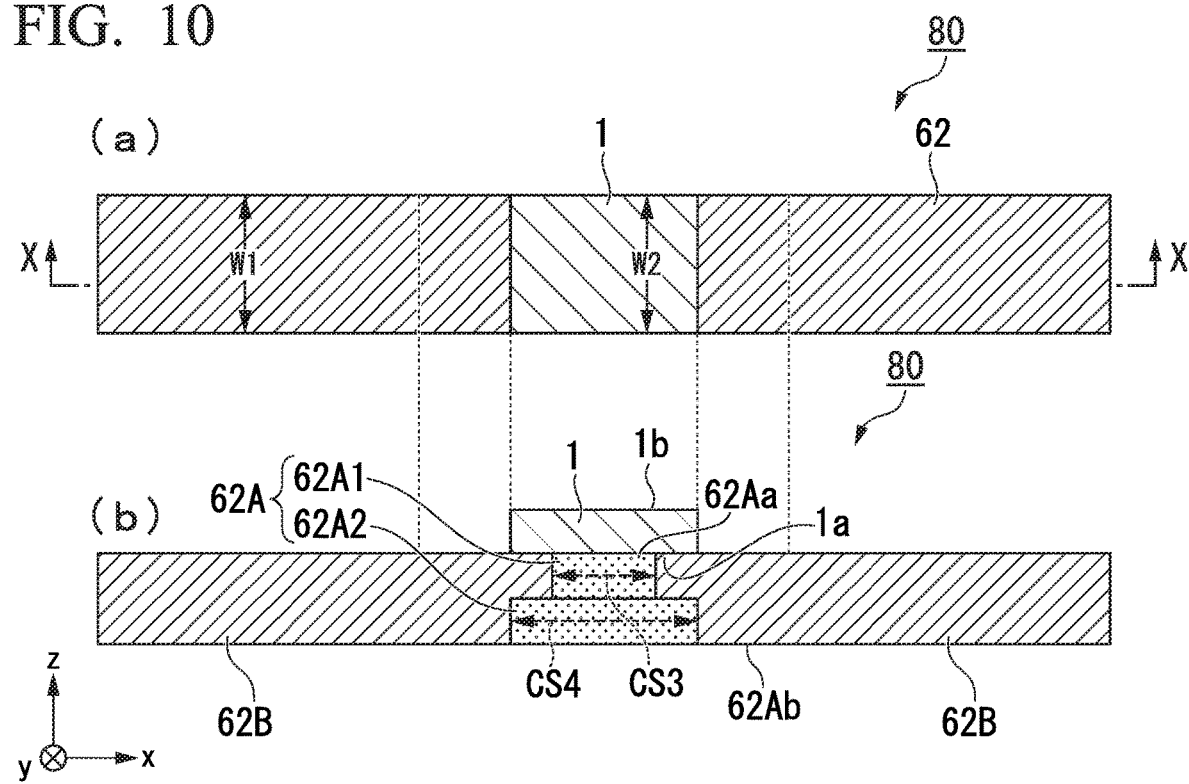
FIG. 10 is a schematic diagram showing another embodiment of the spin current magnetization reversal element of the present disclosure, wherein (a) of FIG. 10 is a plan view and (b) of FIG. 10 is a cross-sectional view.

FIG. 10 shows a schematic diagram of an example of a spin current magnetization reversal element according to another embodiment of the present disclosure. (a) of FIG. 10 is a plan view, and (b) of FIG. 10 is a cross-sectional view taken along line X-X, which is a center line of a spin-orbit torque wiring 62 shown in (a) of FIG. 10 in a width direction thereof. Since the same reference numerals will be used for the same components as those of FIG. 1, descriptions thereof will be omitted.

A spin current magnetization reversal element 80 shown in FIG. 10 is formed so that an area of a cross-section orthogonal to the first direction (the z direction) of a pure spin current generator 62A of the spin-orbit torque wiring 62 stepwisely increases as it recedes from a bonding surface 62Aa bonded to the first ferromagnetic metal layer 1 in the first direction (the z direction). The pure spin current generator 62A is formed so that its cross-sectional area includes a portion 62A1 having a cross-sectional area CS3 and a portion 62A2 increasing in size to become a portion having a cross-sectional area CS4 larger than the cross-section area CS3 as it recedes from the bonding surface 62Aa bonded to the first ferromagnetic metal layer 1 in the first direction (the z direction). In this case, in the pure spin current generator 62A, a current density flowing at the portion 62A1 having a small cross-sectional area is larger than a current density flowing in the portion 62A2 having a large cross-sectional area. As a result, it is possible to improve efficiency of spin injection into the first ferromagnetic metal layer 1 by increasing the density of a pure spin current diffused in the first ferromagnetic metal layer 1.

Figure 11:
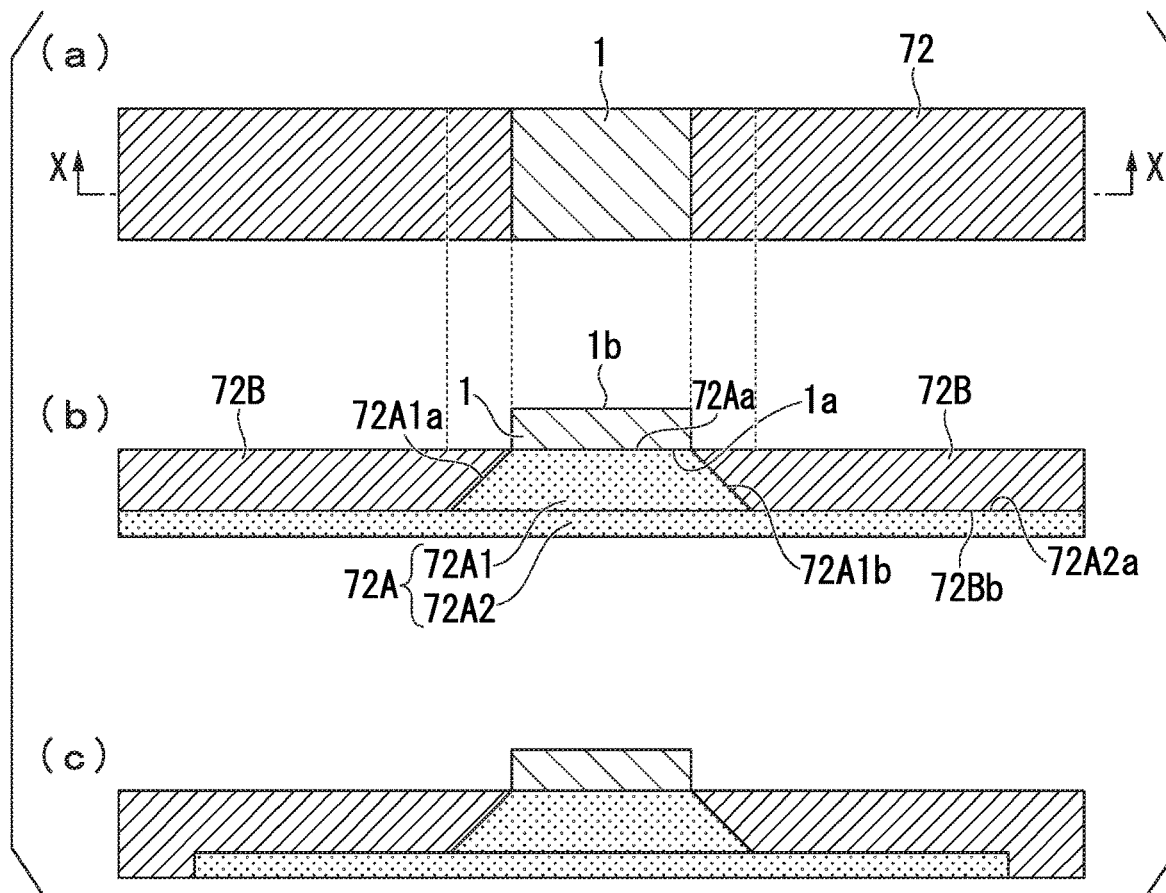
FIG. 11 is a schematic diagram showing another embodiment of the spin current magnetization reversal element of the present disclosure, wherein (a) of FIG. 11 is a plan view, (b) of FIG. 11 is a cross-sectional view, and (c) of FIG. 11 is a cross-sectional view.

FIG. 11 shows a schematic diagram of a modified example of the spin current magnetization reversal element shown in FIG. 1. (a) of FIG. 11 is a plan view, and (b) of FIG. 11 is a cross-sectional view taken along line X-X, which is a center line of a spin-orbit torque wiring 72 shown in (a) of FIG. 11 in a width direction thereof. Since the same reference numerals will be used for the same components as those of FIG. 1, descriptions thereof will be omitted.

The spin-orbit torque wiring 72 shown in FIG. 11 is different from the spin-orbit torque wiring 2 of the spin current magnetization reversal element 10 shown in FIG. 1 largely in that a pure spin current generator 72A includes a first pure spin current generator 72A1 which is bonded to the first surface 1a of the first ferromagnetic metal layer 1 and has a square frustum shape, and a second pure spin current generator 72A2 which is formed on one entire surface opposite the first ferromagnetic metal layer 1 in the spin-orbit torque wiring 72.

The spin-orbit torque wiring 72 includes a portion in which a low-resistance portion 72B and the second pure spin current generator 72A2 are laminated, a portion in which the second pure spin current generator 72A2 and a portion including a slope 72A1a provided between the first pure spin current generator 72A1 and the low-resistance portion 72B are laminated, a portion in which the first pure spin current generator 72A1 and the second pure spin current generator 72A2 are laminated, a portion in which the second pure spin current generator 72A2 and a portion including a slope 72A1b provided between the first pure spin current generator 72A1 and the low-resistance portion 72B are laminated, and a portion in which the low-resistance portion 72B and the second pure spin current generator 72A2 are laminated in the x direction.

Since a contact area between the second pure spin current generator 72A2 and the low-resistance portion 72B in the spin-orbit torque wiring 72 is wide, adhesion between the pure spin current generator 72A and the low-resistance portion 72B is high.

Further, as shown in (c) of FIG. 11, the second pure spin current generator 72A2 may be formed at a part of one surface opposite the first ferromagnetic metal layer 1 in the spin-orbit torque wiring 72 instead of one entire surface thereof as a modified example of the spin-orbit torque wiring 72 shown in FIG. 11. In this modified example, the amount of material of the pure spin current generator can be decreased.

The modification shown in FIG. 11, which is the modified example of the spin current magnetization reversal element 10 of FIG. 1, can also be applied to the spin current magnetization reversal elements shown in FIGS. 4 to 10.

Figure 12:
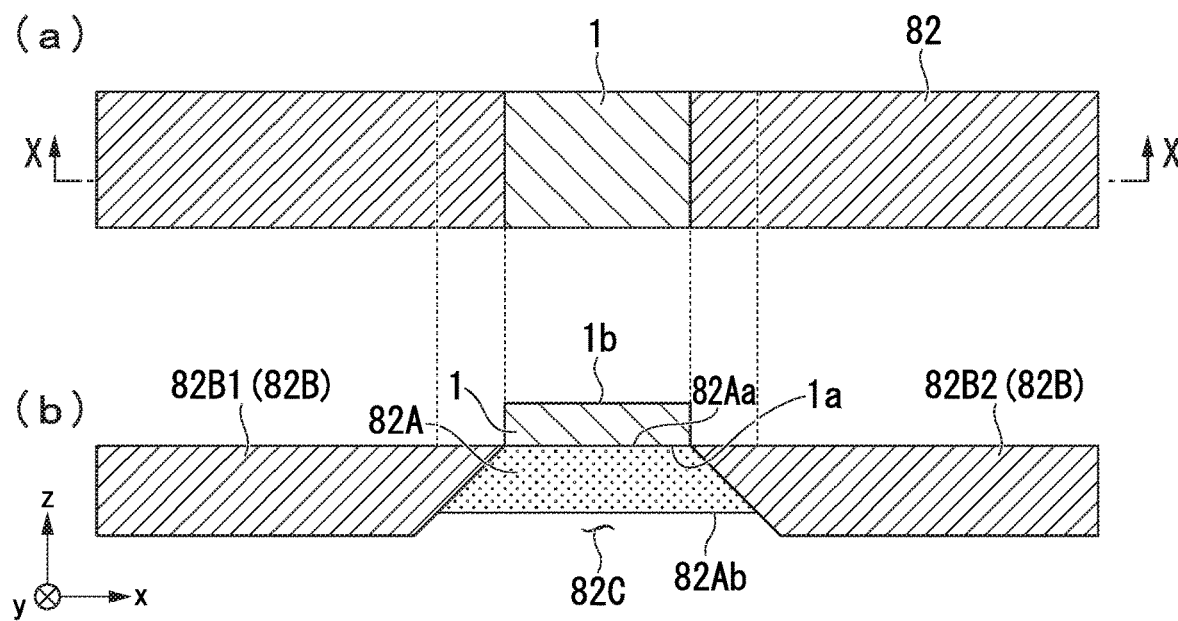
FIG. 12 is a schematic diagram showing another embodiment of the spin current magnetization reversal element of the present disclosure, wherein (a) of FIG. 12 is a plan view and (b) of FIG. 12 is a cross-sectional view.

FIG. 12 shows a schematic diagram of a modified example of the spin current magnetization reversal element shown in FIG. 1. (a) of FIG. 12 is a plan view, and (b) of FIG. 12 is a cross-sectional view taken along line X-X, which is a center line of a spin-orbit torque wiring 82 shown in (a) of FIG. 12 in a width direction thereof. Since the same reference numerals will be used for the same components as those of FIG. 1, descriptions thereof will be omitted.

In the spin-orbit torque wiring 82 shown in FIG. 12, a thickness of a pure spin current generator 82A in the z direction is thinner than that of a low-resistance portion 82B. For that reason, a recessed portion 82c is provided at a surface 82Ab opposite to a bonding surface 82Aa bonding to the first ferromagnetic metal layer 1 in the pure spin current generator 82A. Similarly to FIG. 1, the spin-orbit torque wiring 82 includes the pure spin current generator 82A and the low-resistance portion 82B having a first low-resistance portion 82B1 and a second low-resistance portion 82B2 which are separated from each other with the pure spin current generator 82A interposed therebetween.

Also in the spin-orbit torque wiring 82, a current density at the bonding surface 82Aa bonding to the first ferromagnetic metal layer 1 in the pure spin current generator 82A is the highest, like the embodiment shown in FIG. 1.

The modification shown in FIG. 12, which is the modified example of the spin current magnetization reversal element 10 of FIG. 1, can also be applied to the spin current magnetization reversal elements shown in FIGS. 4 to 10.

Figure 13:
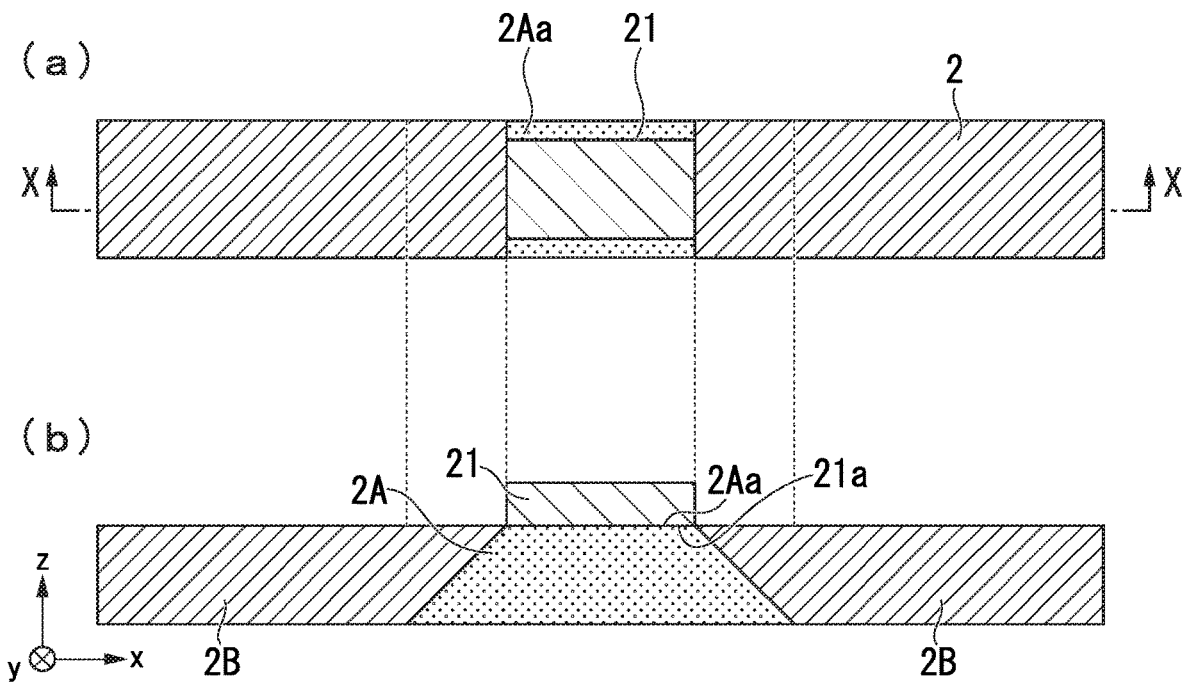
FIG. 13 is a schematic diagram showing another embodiment of the spin current magnetization reversal element of the present disclosure, wherein (a) of FIG. 13 is a plan view and (b) of FIG. 13 is a cross-sectional view.

FIG. 13 shows a schematic diagram of a modified example of the spin current magnetization reversal element shown in FIG. 1. (a) of FIG. 13 is a plan view, and (b) of FIG. 13 is a cross-sectional view taken along line X-X, which is a center line of the spin-orbit torque wiring 2 shown in (a) of FIG. 13 in a width direction thereof. Since the same reference numerals will be used for the same components as those of FIG. 1, descriptions thereof will be omitted.

The spin current magnetization reversal element shown in FIG. 13 is the same as the spin current magnetization reversal element shown in FIG. 1 in that the bonding surface 2Aa bonded to the first ferromagnetic metal layer 21 in the pure spin current generator 2A matches the bonding surface (the first surface) 21a bonded to the pure spin current generator 2A in the first ferromagnetic metal layer 21, but is different in that the first ferromagnetic metal layer 21 is narrower than the spin-orbit torque wiring 2 when viewed from above in the z direction.

Since the spin-orbit torque wiring 2 has the same configuration as the spin-orbit torque wiring 2 shown in FIG. 1, the spin current magnetization reversal element shown in FIG. 13 is also the same as the spin current magnetization reversal element shown in FIG. 1 in that a current is concentrated on the bonding surface 2Aa bonding to the first ferromagnetic metal layer 31 in the pure spin current generator 2A. As a result, since a density of a pure spin current diffused in the first ferromagnetic metal layer 31 bonded to the bonding surface 2Aa increases, it is possible to improve efficiency of spin injection into the first ferromagnetic metal layer 31.

The modification shown in FIG. 13, which is the modified example of the spin current magnetization reversal element 10 of FIG. 1, can also be applied to the spin current magnetization reversal elements shown in FIGS. 4 to 12.

Figure 14:
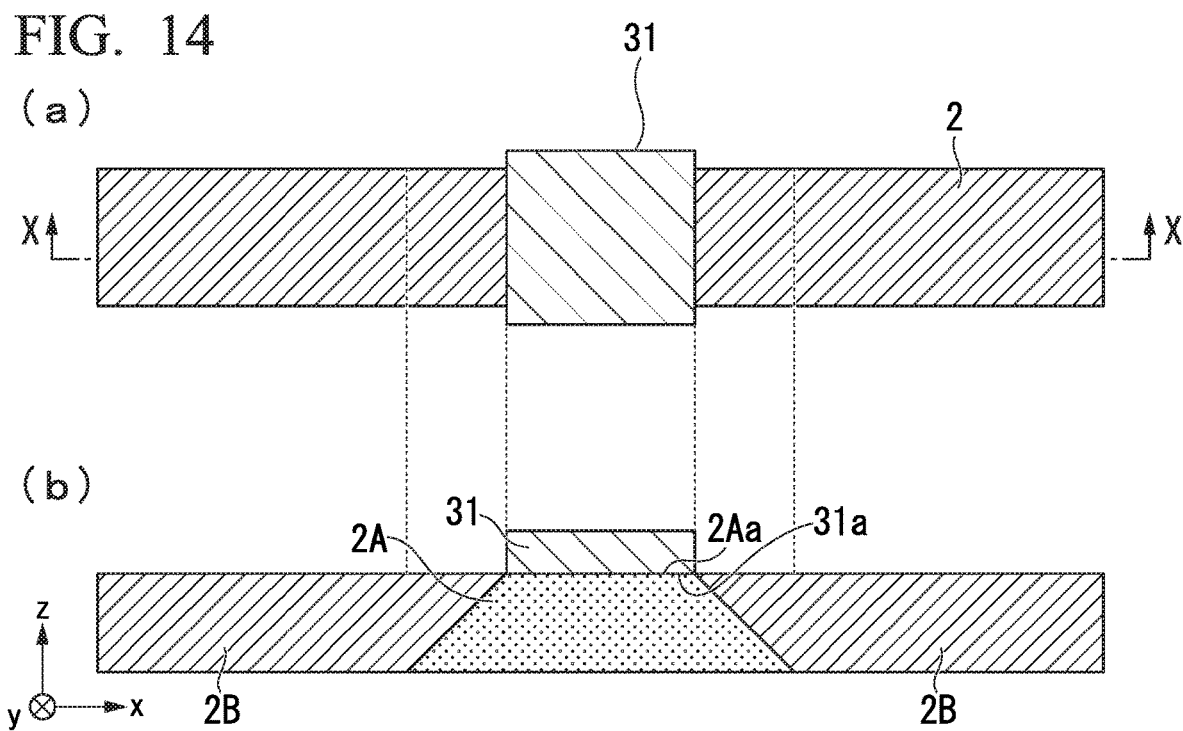
FIG. 14 is a schematic diagram showing another embodiment of the spin current magnetization reversal element of the present disclosure, wherein (a) of FIG. 14 is a plan view and (b) of FIG. 14 is a plan view.

FIG. 14 shows a schematic diagram of a modified example of the spin current magnetization reversal element shown in FIG. 1. (a) in FIG. 14 is a plan view, and (b) of FIG. 14 is a cross-sectional view taken along line X-X, which is a center line of the spin-orbit torque wiring 2 shown in (a) of FIG. 14 in a width direction thereof. Since the same reference numerals will be used for the same components as those of FIG. 1, descriptions thereof will be omitted.

The spin current magnetization reversal element shown in FIG. 14 is the same as the spin current magnetization reversal element shown in FIG. 1 in that the bonding surface 2Aa bonded to the first ferromagnetic metal layer 31 in the pure spin current generator 2A matches the bonding surface (the first surface) 31a bonded to the pure spin current generator 2A in the first ferromagnetic metal layer 31, but is different in that the first ferromagnetic metal layer 31 is wider than the spin-orbit torque wiring 2 when viewed from above in the z direction.

Since the spin-orbit torque wiring 2 has the same configuration as the spin-orbit torque wiring 2 shown in FIG. 1, the spin current magnetization reversal element shown in FIG. 14 is also the same as the spin current magnetization reversal element shown in FIG. 1 in that a current is concentrated on the bonding surface 2Aa bonding to a first ferromagnetic metal layer 41 in the pure spin current generator 2A. As a result, since a density of a pure spin current diffused in the first ferromagnetic metal layer 41 bonded to the bonding surface 2Aa increases, it is possible to improve efficiency of spin injection into the first ferromagnetic metal layer 31.

The modification shown in FIG. 14, which is the modified example of the spin current magnetization reversal element 10 of FIG. 1, can also be applied to the spin current magnetization reversal elements shown in FIGS. 4 to 12.

Figure 15:
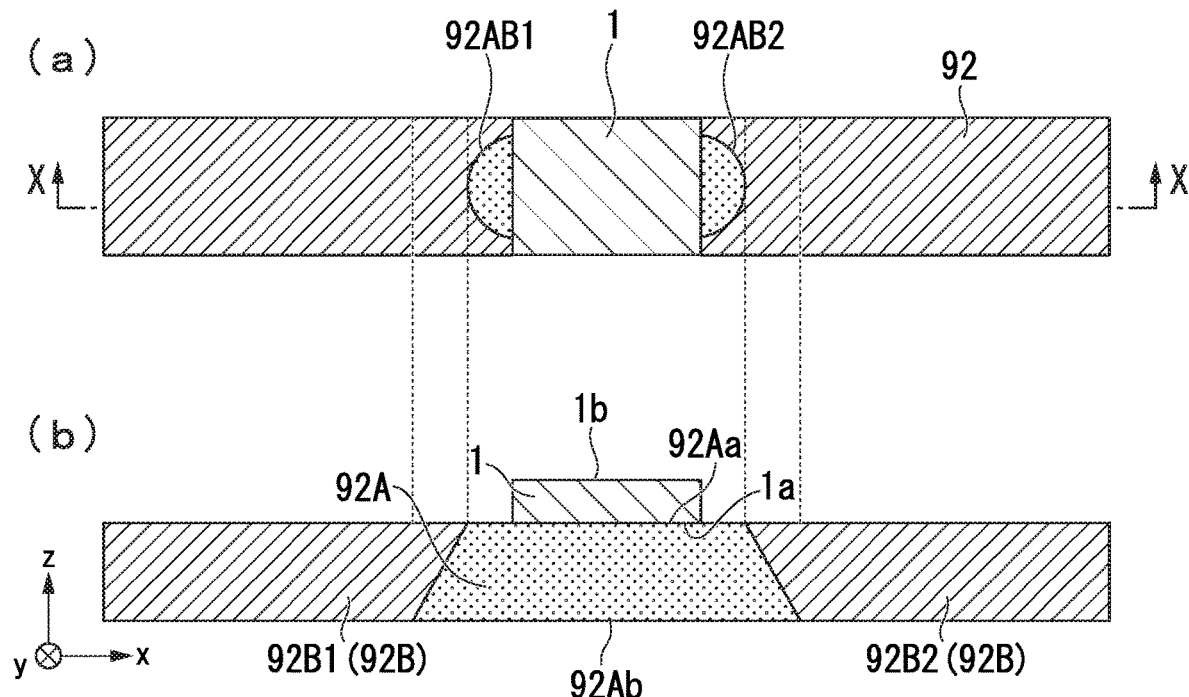
FIG. 15 is a schematic diagram showing another embodiment of the spin current magnetization reversal element of the present disclosure, wherein (a) of FIG. 15 is a plan view and (b) of FIG. 15 is a plan view.

FIG. 15 shows a schematic diagram of a modified example of the spin current magnetization reversal element shown in FIG. 1. (a) of FIG. 15 is a plan view, and (b) of FIG. 15 is a cross-sectional view taken along line X-X, which is a center line of a spin-orbit torque wiring 92 shown in (a) of FIG. 15 in a width direction thereof. Since the same reference numerals will be used for the same components as those of FIG. 1, descriptions thereof will be omitted.

The spin-orbit torque wiring 92 shown in FIG. 15 is different from the spin-orbit torque wiring 2 shown in FIG. 1 in that a bonding surface 92Aa bonded to the first ferromagnetic metal layer 1 in a pure spin current generator 92A has an elliptical shape (a long axis of the elliptical shape is longer than a length of the first ferromagnetic metal layer 1 in the x direction). For that reason, portions indicated by reference numerals 92AB1 and 92AB2 in a boundary between the pure spin current generator 92A and a low-resistance portion 92B do not come into contact with the bonding surface (the first surface) 1a of the ferromagnetic metal layer 1. In other words, only at least a part of the boundary between the pure spin current generator 92A and the low-resistance portion 92B (the boundary other than the boundaries 92AB1 and 92AB2 in (a) of FIG. 15) is in contact with the bonding surface (the first surface) 1a of the first ferromagnetic metal layer 1.

In the pure spin current generator 92A, since a current is most easily concentrated on a position located at a boundary portion with respect to the low-resistance portion 92B and in the vicinity of the bonding surface 92Aa, a pure spin current is easily generated. Thus, the pure spin current can efficiently flow to the first ferromagnetic metal layer 1. Since the pure spin current is diffused and attenuated, the pure spin current generated in the vicinity of the first ferromagnetic metal layer 1 mainly contributes to magnetization reversal of the first ferromagnetic metal layer 1. Since the current is concentrated on the pure spin current generator 92A in the vicinity of the first ferromagnetic metal layer 1, the pure spin current can efficiently flow to the first ferromagnetic metal layer 1.

Similarly to FIG. 1, the spin-orbit torque wiring 92 includes the pure spin current generator 92A and the low-resistance portion 92B, which includes a first low-resistance portion 92B1 and a second low-resistance portion 92B2 which are separated from each other with the pure spin current generator 92A interposed therebetween.

The modification shown in FIG. 15, which is the modified example of the spin current magnetization reversal element 10 of FIG. 1, can also be applied to the spin current magnetization reversal elements shown in FIGS. 4 to 12, and a boundary between the pure spin current generator and the low-resistance portion can have various shapes.

An insulating layer which is bonded to a surface opposite to a surface bonded to the first ferromagnetic metal layer in the spin-orbit torque wiring can be further provided.

In this configuration, it is possible to prevent a current which flows in the spin-orbit torque wiring from leaking from a surface opposite to a surface bonded to the first ferromagnetic metal layer in the case of an application to a magnetoresistance effect element or other purposes, and therefore it is possible to further improve a current concentration effect.

In the above-described embodiment, only a case in which the spin-orbit torque wiring is directly connected to the first ferromagnetic metal layer has been described, but the spin-orbit torque wiring may be connected through other layers such as a cap layer, which will be described later.

The first ferromagnetic metal layer will be described later.

The spin current magnetization reversal element of the present disclosure can be manufactured by a known method.

Hereinafter, a method of manufacturing the spin current magnetization reversal element 10 shown in FIG. 1 will be described.

First, the spin current generator 2A and the first ferromagnetic metal layer 1 can be formed on a predetermined substrate (base material) by using, for example, a magnetron sputtering device. After a film formation, a resist or a protective film is placed on a portion at which a spin current magnetization reversal element is desired to be formed, and an unnecessary portion is removed by an ion milling method or a reactive ion etching (RIE) method. At this time, an apparatus having a mechanism capable of changing a relative angle (an angle θ from the z axis) between the spin current magnetization reversal element 10 and an ion milling direction or an ion irradiation direction of the RIE is used. It is generally known that an element having a good squareness ratio or an element having a frustum shape can be formed by changing the relative angle of the ion irradiation angle with respect to the spin current magnetization reversal element 10.

In a spin current magnetization reversal laminated film having a resist or a protective film disposed thereon, milling is performed for the first ferromagnetic metal layer 1 at a relative angle of 0° to 30°. Accordingly, the first ferromagnetic metal layer 1 having a good squareness ratio is formed. Then, the spin generator is milled while the relative angle is fixed to 30° to 80° so that a spin generator having a linear slope can be formed. Further, a spin generator having a curved slope can be formed by performing milling while changing relative angle.

Then, when the milling is performed after a low-resistance portion is formed and a resist or a protective film is disposed thereon, a spin-orbit torque wiring shape can be formed.

Further, a first ferromagnetic metal layer can be formed later. After the spin generator is formed in a frustum shape by the above-described method, the low-resistance portion is formed, and the spin-orbit torque wiring shape is formed. Then, a flat surface is formed by chemical mechanical polishing (CMP), and the first ferromagnetic metal layer may be laminated thereon.

The substrates used to form the spin current generator 2A and the first ferromagnetic metal layer 1 are generally removed after the film formation, but may be left if necessary.

The spin current magnetization reversal element of the present disclosure can also be applied to a magnetoresistance effect element, as will be described later. The application of the spin current magnetization reversal element is not limited to the magnetoresistance effect element, and another application can also be considered. As another application, for example, the spin current magnetization reversal element can also be used in a spatial light modulator in which the above-described spin current magnetization reversal element is disposed at each pixel and incident light is spatially modulated by a magneto-optical effect, and a magnetic field applied to a magnetization axis of the magnet may be replaced by SOT in order to avoid a hysteresis effect due to coercivity of a magnet in a magnetic sensor.

(Magnetoresistance Effect Element)

A magnetoresistance effect element according to the embodiment of the present disclosure includes the spin current magnetization reversal element of the present disclosure, a second ferromagnetic metal layer of which a magnetization direction is fixed, and a non-magnetic layer sandwiched between a first ferromagnetic metal layer and the second ferromagnetic metal layer.

Figure 16:
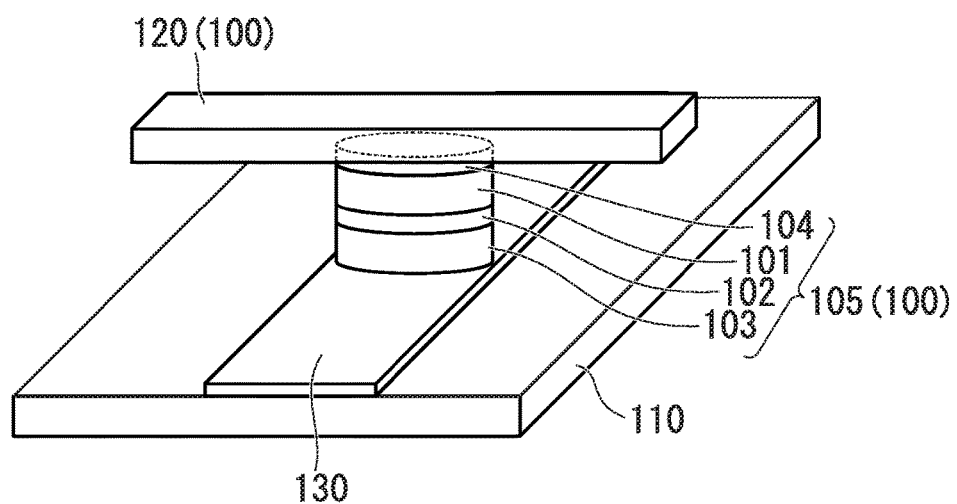
FIG. 16 is a perspective view schematically showing a magnetoresistance effect element according to an embodiment of the present disclosure.

FIG. 16 shows an application example of the spin current magnetization reversal element of the present disclosure, and shows a perspective view schematically showing a magnetoresistance effect element, which is the magnetoresistance effect element according to the embodiment of the present disclosure. Additionally, in FIG. 16, a characteristic part of the spin current magnetization reversal element of the present disclosure is not shown in the drawings.

A magnetoresistance effect element 100 shown in FIG. 16 includes a spin current magnetization reversal element (a first ferromagnetic metal layer 101 and a spin-orbit torque wiring 120) of the present disclosure, a second ferromagnetic metal layer 103 of which a magnetization direction is fixed, and a non-magnetic layer 102 which is sandwiched between the first ferromagnetic metal layer 101 and the second ferromagnetic metal layer 103. Further, it can be said that the magnetoresistance effect element 100 shown in FIG. 15 includes a magnetoresistance effect element portion 105 and the spin-orbit torque wiring 120.

Since the magnetoresistance effect element according to the embodiment of the present disclosure includes the spin-orbit torque wiring 120, it is possible to have a configuration wherein magnetization reversal of the magnetoresistance effect element is performed only by SOT using a pure spin current (hereinafter, referred to as a configuration only using "SOT"), or a configuration wherein SOT of a pure spin current is also used together in a magnetoresistance effect element using STT of a related art (hereinafter, referred to as a configuration using "both STT and SOT").

In the following description with reference to FIG. 16, as an example of a configuration in which the spin-orbit torque wiring extends in a direction intersecting a lamination direction of the magnetoresistance effect element portion, a case of a configuration extending in an orthogonal direction will be described.

FIG. 16 shows a wiring 130 for a flow of a current in the lamination direction of the magnetoresistance effect element 100, and a substrate 110 on which the wiring 130 is formed. Further, a cap layer 104 is provided between the first ferromagnetic metal layer 101 and the spin-orbit torque wiring 120.

<Magnetoresistance Effect Element Portion>

The magnetoresistance effect element portion 105 includes the second ferromagnetic metal layer 103 of which the magnetization direction is fixed, the first ferromagnetic metal layer 101 of which a magnetization direction changes, and the non-magnetic layer 102 which is sandwiched between the second ferromagnetic metal layer 103 and the first ferromagnetic metal layer 101.

Since the magnetization of the second ferromagnetic metal layer 103 is fixed in one direction and the magnetization direction of the first ferromagnetic metal layer 101 relatively changes, a function as the magnetoresistance effect element portion 105 is exhibited. In the case of applying the portion to a coercivity-differed type (pseudo spin valve type) MRAM, a holding force of the second ferromagnetic metal layer is larger than coercivity of the first ferromagnetic metal layer. Further, in the case of applying the portion to an exchange bias type (spin valve type) MRAM, the magnetization direction of the second ferromagnetic metal layer is fixed due to being exchange coupled with the antiferromagnetic layer.

Further, the magnetoresistance effect element portion 105 is a TMR (Tunneling Magnetoresistance) element when the non-magnetic layer 102 is formed as an insulator, and is a GMR (Giant Magnetoresistance) element when the non-magnetic layer 102 is formed of a metal.

A configuration of a known magnetoresistance effect element portion can be used as the magnetoresistance effect element portion of the present disclosure. For example, each layer may include a plurality of layers or may include other layers such as an antiferromagnetic layer for fixing the magnetization direction of the second ferromagnetic metal layer.

The second ferromagnetic metal layer 103 is called a fixed layer or a reference layer, and the first ferromagnetic metal layer 101 is called a free layer or a recording layer.

The second ferromagnetic metal layer 103 and the first ferromagnetic metal layer 101 may be an in-plane magnetization film of which a magnetization direction is an in-plane direction parallel to a layer or a perpendicular magnetization film of which a magnetization direction is a direction perpendicular to the layer.

A known material can be used as a material of the second ferromagnetic metal layer 103. For example, a metal selected from a group consisting of Cr, Mn, Co, Fe, and Ni and an alloy exhibiting ferromagnetism and containing at least one of these metals can be used. An alloy containing these metals and at least one element of B, C, and N can be also used. Specifically, Co—Fe and Co—Fe—B are exemplary examples.

In order to obtain a higher output, it is desirable that a Heusler alloy such as $Co_2FeSi$ is used. The Heusler alloy contains an intermetallic compound having a chemical composition of $X_2YZ$, wherein X indicates a transition metal element or a noble metal element among a Co, Fe, Ni, or Cu group on the periodic table, Y indicates a transition metal among a Mn, V, Cr, or Ti group and can be element species of X, and Z indicates a typical element of group III to group V. For example, $Co_2FeSi$, $Co_2MnSi$, $Co_2Mn_{1-a}Fe_aAl_bS_{1-b}$, and the like are exemplary examples.

Further, an antiferromagnetic material such as IrMn or PtMn may be used as a material in contact with the second ferromagnetic metal layer 103 to further increase coercivity of the second ferromagnetic metal layer 103 with respect to the first ferromagnetic metal layer 101. In addition, in order to prevent leakage of a magnetic field of the second ferromagnetic metal layer 103 from affecting the first ferromagnetic metal layer 101, a synthetic ferromagnetic coupling structure may be adopted.

Furthermore, when the magnetization direction of the second ferromagnetic metal layer 103 is made perpendicular to the laminated surface, it is desirable that a laminated film of Co and Pt is used. Specifically, the second ferromagnetic metal layer 103 may have a structure of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

A ferromagnetic material, preferably, a soft magnetic material, can be applied as a material of the first ferromagnetic metal layer 101. For example, a metal selected from a group consisting of Cr, Mn, Co, Fe, and Ni, an alloy containing at least one of these metals, and an alloy containing these metals and at least one element of B, C, and N can be used. Specifically, Co—Fe, Co—Fe—B, and Ni—Fe are exemplary examples.

When the magnetization direction of the first ferromagnetic metal layer 101 is made perpendicular to the lamination surface, it is desirable for a thickness of the first ferromagnetic metal layer to be set to 2.5 nm or less. It is possible to apply perpendicular magnetic anisotropy to the first ferromagnetic metal layer 101 at a boundary between the first ferromagnetic metal layer 101 and the non-magnetic layer 102. Further, since an effect of the perpendicular magnetic anisotropy is attenuated when the film thickness of the first ferromagnetic metal layer 101 is thickened, it is desirable for the film thickness of the first ferromagnetic metal layer 101 to be decreased.

A known material can be used in the non-magnetic layer 102.

For example, when the non-magnetic layer 102 is formed as an insulator (a tunnel barrier layer), $Al_2O_3$, $SiO_2$, Mg, $MgAl_2O_4$ or the like can be used as the material thereof. In addition, a material in which a part of Al, Si, and Mg is replaced by Zn, Be, and the like can be also used. Among these, since MgO or $MgAl_2O_4$ is a material that can realize coherent tunneling, a spin can be efficiently injected.

Further, when the non-magnetic layer 102 is formed of metal, Cu, Au, Ag, and the like can be used as the material.

Further, it is desirable for the cap layer 104 to be formed on a surface opposite to the non-magnetic layer 102 in the first ferromagnetic metal layer 101, as shown in FIG. 15. The cap layer 104 can prevent diffusion of elements from the first ferromagnetic metal layer 101. Further, the cap layer 104 also contributes to a crystal orientation of each layer of the magnetoresistance effect element portion 105. As a result, when the cap layer 104 is provided, magnetism of the first ferromagnetic metal layer 101 and the second ferromagnetic metal layer 103 of the magnetoresistance effect element portion 105 is stabilized, and thus resistance of the magnetoresistance effect element portion 105 can be decreased.

It is desirable for a material with high conductivity to be used for the cap layer 104. For example, Ru, Ta, Cu, Ag, Au, and the like can be used. A crystal structure of the cap layer 104 is desirably set appropriately for an fcc structure, an hcp structure, or a bcc structure according to a crystal structure of an adjacent ferromagnetic metal layer.

Further, it is desirable for any one selected from a group consisting of silver, copper, magnesium, and aluminum to be used for the cap layer 104. Although it will be described later in detail, when the spin-orbit torque wiring 120 and the magnetoresistance effect element portion 105 are connected through the cap layer 104, it is desirable for the cap layer 104 to prevent dissipation of the spin transmitted from the spin-orbit torque wiring 120. It is known that silver, copper, magnesium, aluminum, and the like have a long spin diffusion length of 100 nm or more such that the spin hardly dissipates.

It is desirable for a thickness of the cap layer 104 to be smaller than or equal to the spin diffusion length of the material constituting the cap layer 104. When the thickness of the cap layer 104 is smaller than or equal to the spin diffusion length, the spin transmitted from the spin-orbit torque wiring 120 can be sufficiently transmitted to the magnetoresistance effect element portion 105.

<Substrate>

It is desirable for the substrate 110 to have high flatness. In order to obtain a surface having a high flatness, for example, Si, AlTiC, and the like can be used as a material thereof.

An underlayer (not shown) may be formed on a surface of the substrate 110 on a side of the magnetoresistance effect element portion 105. When the underlayer is provided, it is possible to control crystallinity such as a crystal orientation and a crystal grain size of each layer including the second ferromagnetic metal layer 103 laminated on the substrate 110.

It is desirable for the underlayer to have an insulating property. This countermeasure is for preventing a current flowing in the wiring 130 from dissipating. Various materials can be used for the underlayer.

For example, as one example, a nitride layer having a (001)-oriented NaCl structure and containing at least one element selected from a group of Ti, Zr, Nb, V, Hf, Ta, Mo, W, B, Al, and Ce can be used for the underlayer.

As another example, a layer of (002)-oriented perovskite-based conductive oxide represented by a composition formula of $XYO_3$ can be used for the underlayer. Here, X site contains at least one element selected from a group of Sr, Ce, Dy, La, K, Ca, Na, Pb, and Ba, and Y site contains at least one element selected from a group of Ti, V, Cr, Mn, Fe, Co, Ni, Ga, Nb, Mo, Ru, Ir, Ta, Ce, and Pb.

As another example, a layer of an oxide having a (001)-oriented NaCl structure and containing at least one element selected from a group of Mg, Al, and Ce can be used for the underlayer.

As another example, a layer having a (001)-oriented tetragonal structure or a cubic crystal structure and containing at least one element selected from a group of Al, Cr, Fe, Co, Rh, Pd, Ag, Ir, Pt, Au, Mo, and W can be used for the underlayer.

Further, the underlayer is not limited to a single layer, and may be obtained by laminating a plurality of layers described in the above-described example. By studying a structure of the underlayer, crystallinity of each layer of the magnetoresistance effect element portion 20 can be enhanced and magnetic characteristics can be improved.

<Wiring>

The wiring 130 is electrically connected to the second ferromagnetic metal layer 21 of the magnetoresistance effect element portion 20, and, in FIG. 5, the wiring 130, the spin-orbit torque wiring 120, and a power supply (not shown) form a closed circuit so that a current flows in a lamination direction of the magnetoresistance effect element portion 20.

The wiring 130 is not particularly limited as long as the wiring has high conductivity. For example, aluminum, silver, copper, gold, and the like can be used.

In the above-described embodiment, a so-called bottom pin structure of the magnetoresistance effect element 100 has been described in which the first ferromagnetic metal layer 101 laminated later and disposed farther from the substrate 110 is a magnetization free layer and the second ferromagnetic metal layer 103 laminated first and disposed closer to the substrate 110 is a magnetization fixed layer (a pinned layer), but the structure of the magnetoresistance effect element 100 is not particularly limited and may have a top pin structure.

The magnetoresistance effect element of the present disclosure can be manufactured by using a known method.

The magnetoresistance effect element portion can be formed by using, for example, a magnetron sputtering device. When the magnetoresistance effect element portion is a TMR element, for example, a tunnel barrier layer can be formed by providing a thin metal film having about 0.4 to 2.0 nm by sputtering aluminum and a plurality of non-magnetic elements which becomes a divalent cation on the second ferromagnetic metal layer first, performing plasma oxidation or natural oxidation by introducing oxygen thereto, and performing a heat treatment thereon. As the film forming method, a thin film forming method such as a vapor deposition method, a laser ablation method, and an MBE method can be used in addition to the magnetron sputtering method.

It is desirable for a pure spin current generator to be formed first after forming a film of the magnetoresistance effect element portion and forming a shape thereof. This is because high efficiency is obtained by a structure capable of maximally preventing scattering of a pure spin current from the pure spin current generator to the magnetoresistance effect element portion.

After the magnetoresistance effect element portion is formed and its shape is formed, the periphery of the processed magnetoresistance effect element portion is filled with a resist or the like to form surfaces including a top surface of the magnetoresistance effect element portion. At this time, it is desirable for a top surface of the magnetoresistance effect element portion to be flattened. Since the surface is flattened, it is possible to prevent scattering of a spin at a boundary face between the pure spin current generator and the magnetoresistance effect element portion.

Next, a layer made of a material of the pure spin current generator is formed on a top surface of the flattened magnetoresistance effect element portion. Sputtering or the like can be used to form the film.

Next, a resist or a protective film is placed on a portion at which the pure spin current generator is desired to be manufactured, and unnecessary portions are removed by ion milling or reactive ion etching (RIE).

Next, a material constituting a low-resistance portion is formed by sputtering or the like and the resist or the like is peeled to prepare the spin-orbit torque wiring. In the case in which the shape of the pure spin current generator is complicated, the formation of the resist or the protective film and the formation of the pure spin current generator may be separately formed a plurality of times.

Figure 17:
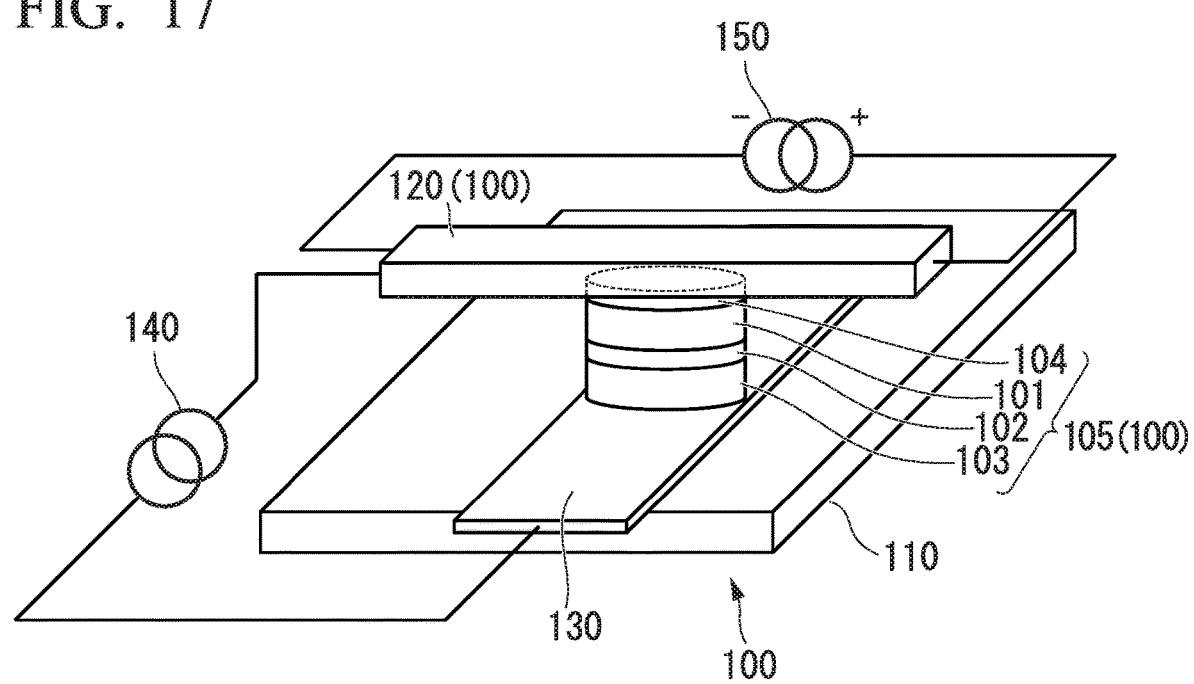
FIG. 17 is a perspective view schematically showing the magnetoresistance effect element according to the embodiment of the present disclosure.

FIG. 17 shows the magnetoresistance effect element 100 shown in FIG. 16 in which a first power supply 140 is provided so that a current flows in the lamination direction of the magnetoresistance effect element portion 105 and a second power supply 150 is provided so that a current flows in the spin-orbit torque wiring 120.

The first power supply 140 is connected to the wiring 130 and the spin-orbit torque wiring 120. The first power supply 140 can control the current flowing in the lamination direction of the magnetoresistance effect element 100.

The second power supply 150 is connected to both ends of the spin-orbit torque wiring 120. The second power supply 150 can control the current flowing in the spin-orbit torque wiring 120, that is, the current flowing in a direction orthogonal to the lamination direction of the magnetoresistance effect element portion 105.

As described above, the current flowing in the lamination direction of the magnetoresistance effect element portion 105 induces STT. In contrast, the current flowing in the spin-orbit torque wiring 120 induces SOT. Both STT and SOT contribute to magnetization reversal of the first ferromagnetic metal layer 101.

In this way, when the amount of the current flowing in the lamination direction of the magnetoresistance effect element portion 105 and the current flowing in the direction orthogonal to the lamination direction is controlled by two power supplies, a contribution ratio of SOT and STT contributing to the magnetization reversal can be freely controlled.

For example, in the case in which a large current cannot flow in a device, control can be performed such that STT with high energy efficiency for magnetization reversal is mainly used. That is, the amount of the current flowing from the first power supply 140 can be increased and the amount of the current flowing from the second power supply 150 can be decreased.

In addition, for example, when the thickness of the non-magnetic layer 102 is inevitably decreased due to a necessity of manufacturing a thin device, it is necessary to decrease the current flowing in the non-magnetic layer 102. In this case, when the amount of the current flowing from the first power supply 140 is decreased and the amount of the current flowing from the second power supply 150 is increased, it is possible to increase the SOT contribution rate.

As the first power supply 140 and the second power supply 150, known power supplies can be used.

As described above, according to the magnetoresistance effect element in the case of the configuration using both "STT and SOT" of the present disclosure, the contribution rates of STT and SOT can be freely controlled by the amount of the current supplied from the first power supply and the second power supply. For that reason, since it is possible to freely control the contribution rates of STT and SOT in response to performance required in the device, the magnetoresistance effect element can be operated with more versatility.

(Magnetic Memory)

A magnetic memory (MRAM) of the present disclosure includes a plurality of magnetoresistance effect elements of the present disclosure.

(Magnetization Reversal Method)

In a magnetization reversal method, a current density of a current flowing in a spin-orbit torque wiring of the magnetoresistance effect element of the present disclosure can be less than $1 \times 10^7$ A/cm$^2$.

When the current density of the current flowing in the spin-orbit torque wiring is too large, heat is generated by the current flowing in the spin-orbit torque wiring. When the heat is applied to a second ferromagnetic metal layer, stability of a magnetization of the second ferromagnetic metal layer may disappear, and thus unexpected magnetization reversal or the like may occur. When such unexpected magnetization reversal occurs, a problem arises in that recorded information is rewritten. That is, it is desirable for a current density of the current flowing in the spin-orbit torque wiring to be adjusted so that the current density does not excessively increase to avoid the unexpected magnetization reversal. When the current density of the current flowing in the spin-orbit torque wiring is less than $1 \times 10^7$ A/cm$^2$, it is possible to prevent at least the magnetization reversal caused by generated heat.

In the magnetization reversal method, when the magnetoresistance effect element of the present disclosure has a configuration of using "STT and SOT," a current may be applied to the power supply of the magnetoresistance effect element after a current is applied to the power supply of the spin-orbit torque wiring.

The SOT magnetization reversal step and the STT magnetization reversal step may be performed at the same time, or the STT magnetization reversal step may be performed after the SOT magnetization reversal step is performed in advance. A current may be supplied from the first power supply 140 and the second power supply 150 at the same time, or a current may be supplied from the first power supply 140 after a current is supplied from the second power supply 150. However, it is desirable for a current to be applied to the power supply of the magnetoresistance effect element after a current is applied to the power supply of the spin-orbit torque wiring to more certainly obtain a magnetization reversal assisting effect using SOT. That is, it is desirable for a current to be supplied from the first power supply 140 after a current is supplied from the second power supply 150.

REFERENCE SIGNS LIST

1, 11 First ferromagnetic metal layer
2, 12, 22, 32, 42, 52, 62, 72, 82, 92 Spin-orbit torque wiring
2A, 12A, 22A, 32A, 42A, 52A, 62A, 72A, 82A, 92A Pure spin current generator
2B, 12B, 22B, 32B, 42B, 52B, 62B, 72B, 82B, 92B Low-resistance portion
100 Magnetoresistance effect element
101 First ferromagnetic metal layer
102 Non-magnetic layer
103 Second ferromagnetic metal layer

The invention claimed is:

1. A spin current magnetization reversal element comprising:
    a first ferromagnetic metal layer with a changeable magnetization direction; and
    a spin-orbit torque wiring, wherein a first direction is defined as a direction perpendicular to a surface of the first ferromagnetic metal layer, the spin-orbit torque wiring extends in a second direction intersecting the first direction, and the spin-orbit torque wiring is bonded to a first surface of the first ferromagnetic metal layer,
    wherein the spin-orbit torque wiring includes a pure spin current generator which is bonded to the first surface of the first ferromagnetic metal layer and a low-resistance portion which is connected to each of both ends of the pure spin current generator in the second direction and which is formed of a material having a smaller electrical resistivity than the pure spin current generator,
    the pure spin current generator has a configuration wherein an area of a cross-section thereof orthogonal to the first direction continuously and/or stepwise increases as it recedes from a bonding surface bonded to the first ferromagnetic metal layer in the first direction,
    the pure spin current generator includes a non-magnetic metal having an atomic number of 39 or more and having d electrons or f electrons, and electric resistivity of the pure spin current generator is two or more times larger than electric resistivity of the low-resistance portion.

2. The spin current magnetization reversal element according to claim 1,
wherein the low-resistance portion connected to one end of the pure spin current generator and the low-resistance portion connected to the other end of the pure spin current generator are separated from each other.

3. The spin current magnetization reversal element according to claim 2,
wherein the bonding surface of the pure spin current generator is included in an area overlapping the first surface of the first ferromagnetic metal layer.

4. The spin current magnetization reversal element according to claim 2,
wherein at least a part of a boundary between the pure spin current generator and the low-resistance portion is in contact with the first surface of the first ferromagnetic metal layer.

5. The spin current magnetization reversal element according to claim 1,
wherein the bonding surface of the pure spin current generator is included in an area overlapping the first surface of the first ferromagnetic metal layer.

6. The spin current magnetization reversal element according to claim 5,
wherein at least a part of a boundary between the pure spin current generator and the low-resistance portion is in contact with the first surface of the first ferromagnetic metal layer.

7. The spin current magnetization reversal element according to claim 1,
wherein at least a part of a boundary between the pure spin current generator and the low-resistance portion is in contact with the first surface of the first ferromagnetic metal layer.

8. The spin current magnetization reversal element according to claim 1,
wherein the low-resistance portion includes a first low-resistance portion and a second low-resistance portion which are separated from each other with the pure spin current generator interposed therebetween.

9. The spin current magnetization reversal element according to claim 1, further comprising:
an insulating layer which is bonded to a surface of the spin-orbit torque wiring opposite to a surface bonded to the first ferromagnetic metal layer in the spin-orbit torque wiring.

10. The spin current magnetization reversal element according to claim 1,
wherein a width of the spin-orbit torque wiring is identical to a width of the first ferromagnetic metal layer.

11. A magnetoresistance effect element comprising:
the spin current magnetization reversal element according to claim 1;
a second ferromagnetic metal layer of which a magnetization direction is fixed; and
a non-magnetic layer which is interposed between the first ferromagnetic metal layer and the second ferromagnetic metal layer.

12. A magnetic memory comprising:
a plurality of the magnetoresistance effect elements according to claim 11.

13. The spin current magnetization reversal element according to claim 1,
wherein the pure spin current generator has an isosceles trapezoidal prism shape or a square frustum shape which includes; an upper surface which is bonded to the first surface of the first ferromagnetic metal layer, two square sides which are connected to the low-resistance portion, and two trapezoidal sides.

14. The spin current magnetization reversal element according to claim 1, wherein the spin current magnetization reversal element includes at least one of the characteristics (i) and (ii):
(i) an upper surface of the pure spin current generator and an upper surface of the low-resistance portion form a continuous flat surface, and
(ii) a lower surface of the pure spin current generator and a lower surface of the low-resistance portion form a continuous flat surface.

15. The spin current magnetization reversal element according to claim 1, wherein the spin current magnetization reversal element includes one of the characteristics (i) to (v):
(i) wherein a lower surface of the first ferromagnetic metal layer as a bonding surface and an upper surface of the pure spin current generator as a bonding surface completely overlap when viewed from above;
(ii) a thickness of the pure spin current generator is thinner than that of the low-resistance portion such that a recessed portion is provided at a lower surface of the spin-orbit torque wiring;
(iii) the first ferromagnetic metal layer is wider than the spin-orbit torque wiring when viewed from above;
(iv) the first ferromagnetic metal layer is narrower than the spin-orbit torque wiring when viewed from above; and
(v) the wide of the first ferromagnetic metal layer is the same as that of the spin-orbit torque wiring when viewed from above.

16. A spin current magnetization reversal element comprising:
a first ferromagnetic metal layer with a changeable magnetization direction; and
a spin-orbit torque wiring, wherein a first direction is defined as a direction perpendicular to a surface of the first ferromagnetic metal layer, the spin-orbit torque wiring extends in a second direction intersecting the first direction, and the spin-orbit torque wiring is bonded to a first surface of the first ferromagnetic metal layer,
wherein the spin-orbit torque wiring includes a pure spin current generator which is bonded to the first surface of the first ferromagnetic metal layer and a low-resistance portion which is connected to each of both ends of the pure spin current generator in the second direction and which is formed of a material having a smaller electrical resistivity than the pure spin current generator,
the pure spin current generator has a configuration wherein an area of a cross-section thereof orthogonal to the first direction continuously and/or stepwisely increases as it recedes from a bonding surface bonded to the first ferromagnetic metal layer in the first direction, and
the spin current magnetization reversal element includes one of the characteristics (i) and (ii):
(i) in the spin-orbit torque wiring, a surface of the pure spin current generator which is bonding to the first ferromagnetic metal layer protrudes upward to be separated from the low-resistance portion; and
(ii) in the spin-orbit torque wiring, a surface of the pure spin current generator which is opposite to the bonding surface bonding to the first ferromagnetic metal layer protrudes downward to be separated from the first ferromagnetic metal layer and the low-resistance portion.

17. A spin current magnetization reversal element comprising:
- a first ferromagnetic metal layer with a changeable magnetization direction; and
- a spin-orbit torque wiring, wherein a first direction is defined as a direction perpendicular to a surface of the first ferromagnetic metal layer, the spin-orbit torque wiring extends in a second direction intersecting the first direction, and the spin-orbit torque wiring is bonded to a first surface of the first ferromagnetic metal layer,
wherein the spin-orbit torque wiring includes a pure spin current generator which is bonded to the first surface of the first ferromagnetic metal layer and a low-resistance portion which is connected to each of both ends of the pure spin current generator in the second direction and which is formed of a material having a smaller electrical resistivity than the pure spin current generator,
the pure spin current generator has a configuration wherein an area of a cross-section thereof orthogonal to the first direction continuously and/or stepwisely increases as it recedes from a bonding surface bonded to the first ferromagnetic metal layer in the first direction,
the pure spin current generator has a structure wherein a first pure spin current generator is provided on a second pure spin current generator,
the first pure spin current generator is bonded to the first surface of the first ferromagnetic metal layer and has an isosceles trapezoidal prism shape or a square frustum shape, and
the second pure spin current generator is formed on one entire surface of the spin-orbit torque wiring opposite to the first ferromagnetic metal layer or is formed at a part of one surface of the spin-orbit torque wiring opposite to the first ferromagnetic metal layer.

\* \* \* \* \*